US012805351B2

(12) United States Patent
Gamba et al.

(10) Patent No.: US 12,805,351 B2
(45) Date of Patent: Nov. 17, 2026

(54) ELECTROLYTIC SURFACE FINISH ARCHITECTURE

(71) Applicant: Intel Corporation, Santa Clara, CA (US)

(72) Inventors: Jason M. Gamba, Gilbert, AZ (US); Haifa Hariri, Phoenix, AZ (US); Kristof Darmawikarta, Chandler, AZ (US); Srinivas V. Pietambaram, Chandler, AZ (US); Hiroki Tanaka, Gilbert, AZ (US); Kyle Mcelhinny, Tempe, AZ (US); Xiaoying Guo, Chandler, AZ (US); Steve S. Cho, Chandler, AZ (US); Ali Lehaf, Phoenix, AZ (US); Haobo Chen, Gilbert, AZ (US); Bai Nie, Chandler, AZ (US); Numair Ahmed, Chandler, AZ (US)

(73) Assignee: Intel Foundry IP LLC, Santa Clara, CA (US)

( * ) Notice: Subject to any disclaimer, the term of this patent is extended or adjusted under 35 U.S.C. 154(b) by 220 days.

(21) Appl. No.: 17/953,206

(22) Filed: Sep. 26, 2022

(65) Prior Publication Data

US 2024/0105575 A1 Mar. 28, 2024

(51) Int. Cl.
*H10W 70/65* (2026.01)
*C25D 3/12* (2006.01)
(Continued)

(52) U.S. Cl.
CPC .............. *H10W 70/65* (2026.01); *C25D 3/12* (2013.01); *C25D 3/48* (2013.01); *C25D 3/50* (2013.01);
(Continued)

(58) Field of Classification Search
None
See application file for complete search history.

(56) References Cited

U.S. PATENT DOCUMENTS 5,375,320 A * 12/1994 Kinsman ............ H05K 13/0092 29/827
8,143,534 B2 * 3/2012 Hando ................ H05K 3/3436 174/262
(Continued)

FOREIGN PATENT DOCUMENTS

DE 102006012322 A1 10/2006

OTHER PUBLICATIONS

Office Action from U.S. Appl. No. 17/953,210, mailed Jan. 20, 2026, 10 pgs.

*Primary Examiner* — Krystal Robinson
(74) *Attorney, Agent, or Firm* — Schwabe, Williamson & Wyatt, P.C.

(57) ABSTRACT

Embodiments disclosed herein include package substrates and methods of forming package substrates. In an embodiment, the package substrate comprises a core, and a pad over the core, where the pad has a first width. In an embodiment, a surface finish is over the pad, where the surface finish has a second width that is substantially equal to the first width. In an embodiment, the package substrate further comprises a solder resist over the pad, where the solder resist comprises an opening that exposes a portion of the surface finish. In an embodiment, the opening has a third width that is smaller than the second width.

19 Claims, 30 Drawing Sheets

(51) Int. Cl.

| | |
|---|---|
| ***C25D 3/48*** | (2006.01) |
| ***C25D 3/50*** | (2006.01) |
| ***C25D 7/12*** | (2006.01) |
| ***H10W 70/05*** | (2026.01) |
| ***H10W 70/66*** | (2026.01) |
| ***H10W 99/00*** | (2026.01) |
| *H10W 70/692* | (2026.01) |
| *H10W 90/00* | (2026.01) |

(52) U.S. Cl.
CPC ............ *C25D 7/123* (2013.01); *H10W 70/05* (2026.01); *H10W 70/66* (2026.01); *H10W 99/00* (2026.01); *H10W 70/692* (2026.01); *H10W 90/724* (2026.01)

(56) References Cited

U.S. PATENT DOCUMENTS

2003/0015348 A1* 1/2003 Lee ........................ H05K 1/021
257/E23.101
2006/0225918 A1 10/2006 Chinda et al.
2009/0109642 A1* 4/2009 Chung ................. H05K 1/0271
361/783
2010/0065322 A1* 3/2010 Ogawa ................. H05K 1/0313
156/60
2010/0117202 A1* 5/2010 Eu ..................... B29C 45/14655
425/588
2010/0309641 A1* 12/2010 Hata ...................... H05K 3/244
257/737
2012/0155048 A1* 6/2012 Kaneko .................. H05K 3/381
174/250
2012/0175158 A1* 7/2012 Ogawa ................... H05K 1/111
174/250
2012/0293973 A1* 11/2012 Nakamura ............. H05K 1/036
361/783
2013/0320547 A1 12/2013 Zhang
2013/0329391 A1* 12/2013 Ishizuka .............. H05K 1/0271
228/175
2014/0069694 A1 3/2014 Cho
2014/0182904 A1* 7/2014 Park ....................... H05K 3/387
174/250
2020/0343293 A1 10/2020 Kawano
2022/0071009 A1 3/2022 LeClair
2024/0222259 A1* 7/2024 Chen ................... H10W 70/685
2024/0321656 A1* 9/2024 Duan .................. H10W 70/635

* cited by examiner

ELECTROLYTIC SURFACE FINISH ARCHITECTURE

TECHNICAL FIELD

Embodiments of the present disclosure relate to electronic packages, and more particularly to electronic packages with electrolytic surface finishes on pads in a package substrate.

BACKGROUND

In semiconductor packaging solutions, one trend is toward the use of glass cores. The glass cores provide a stiffer core that can also have a flatter surface. This enables finer pitch routing in the buildup layers. Additionally, through glass vias can be used and are more electrically favorable than plated through holes used in traditional organic cores. However, packaging solutions that use glass cores are not compatible with traditional electroless plating processes. In many electroless plating processes, the package substrate is subjected to a shock and sway process. The shock and sway process involves mechanically shaking the substrate in order to prevent the formation of bubbles on the surfaces to be plated. Unfortunately, the shock and sway process may result in damage to the glass core (breaking, cracking, etc.). As such, the surface finishes of pads for glass core architectures need to be plated with an electrolytic plating process. This makes the plating process more complex.

EMBODIMENTS OF THE PRESENT DISCLOSURE

Figure 1A:
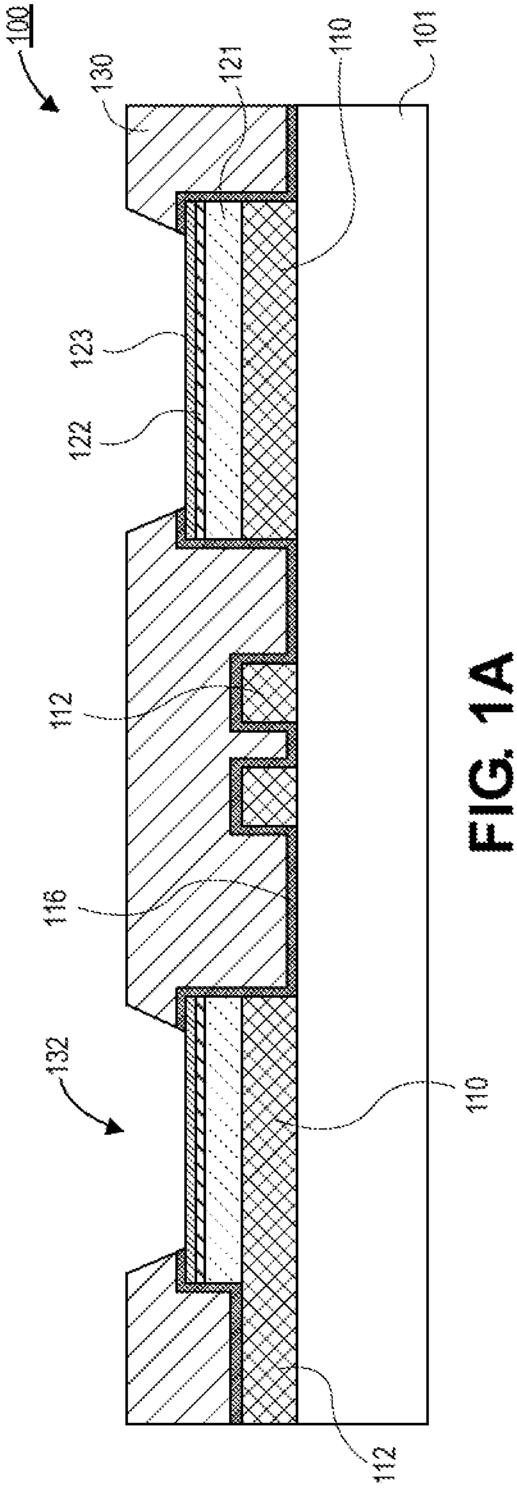
FIG. 1A is a cross-sectional illustration of a package substrate with a glass core and surface finishes over the pads that are formed with an electrolytic process, in accordance with an embodiment.

Described herein are electronic packages with electrolytic surface finishes on pads in a package substrate, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, package substrates with glass cores are not compatible with shock and sway processes that are necessary in order to plate high quality electroless surface finishes. Accordingly, embodiments disclosed herein include package substrate architectures that include surface finishes that are plated with an electrolytic plating process. Particularly, a continuous seed layer is provided in order to enable the electrolytic plating. In an embodiment, the seed layer is the same seed layer used to plate the pads. In other embodiments, a seed layer is deposited after the formation of the pads (e.g., over the solder resist layer). The use of electrolytic plating also results in the formation of distinct architectures that can be used to determine that electrolytic plating was used in order to form the package substrates.

In an embodiment, the package substrates may be referred to as having cores that comprise glass, or simply glass cores. That is, the core may be substantially all glass. This is in contrast to existing core architectures that may include an organic substrate that includes glass fiber reinforcement. The glass cores may have thicknesses that are between approximately 50 μm and approximately 1,000 μm. Though thicker or thinner cores may also be used in some embodiments. As used herein, "approximately" may refer to a range that is within ten percent of the stated value. For example, approximately 1,000 μm may refer to a range between 900 μm and 1,100 μm. Additionally, while described as being a glass core, embodiments are not limited to glass core architectures. For example, electrolytic plating of the surface finishes described herein may also be used in conjunction with organic core substrates.

Referring now to FIG. 1A, a cross-sectional illustration of a package substrate 100 is shown, in accordance with an embodiment. In an embodiment, the package substrate 100 may include a core 101. For example, the core 101 may comprise glass, such as a borosilicate glass or a fused silica glass. While a glass core 101 is shown, it is to be appreciated that one or more buildup layers may be provided between the glass core 101 and the pads 110 or traces 112. That is, the pads 110 and traces 112 may not be directly on the core 101 in some embodiments. In an embodiment, the core 101 is shown as a monolithic block. However, in some embodiments through glass vias (TGVs), or other conductive features may be provided in the core 101. In the illustrated embodiment, only a single side of the core 101 is shown for simplicity. However, it is to be appreciated that pads, traces, and the like may also be formed on the bottom surface of the core 101, as will be described in greater detail below.

In an embodiment, pads 110 may be formed over the core 101. The pad 110 on the right side is just a pad 110, and the pad 110 on the left side includes a trace 112 that extends out from the pad 110. The pads 110 are covered by a surface finish. As used herein, a surface finish may include one or more layers of conductive material that minimizes diffusion, prevents oxidation, or the like. For example, the surface finish shown in FIG. 1A includes three layers 121, 122, and 123. In a particular embodiment, the first layer 121 comprises nickel, the second layer 122 comprises palladium, and the third layer 123 comprises gold.

In an embodiment, the surface finish layers 121-123 may have a width that is substantially equal to a width of the pads 110. Additionally, the surface finish layers 121-123 may be wider than an opening 132 through the overlying solder resist 130. This is in contrast to existing electroless processes where the solder resist opening 132 serves as a mask for the surface finish layers 121-123. In those cases, the width of the surface finish layers 121-123 is substantially equal to a width of the opening 132. Additionally, portions of the surface finish layers 121-123 may be separated from the solder resist 130 by a portion of an adhesion promoting layer 116. For example, the adhesion promoting layer 116 may comprise silicon and nitrogen. The adhesion promoting layer 116 may also be over the traces 112 and over the top surface of the underlying core 101 (or underlying buildup layers (not shown)).

Figure 1B:
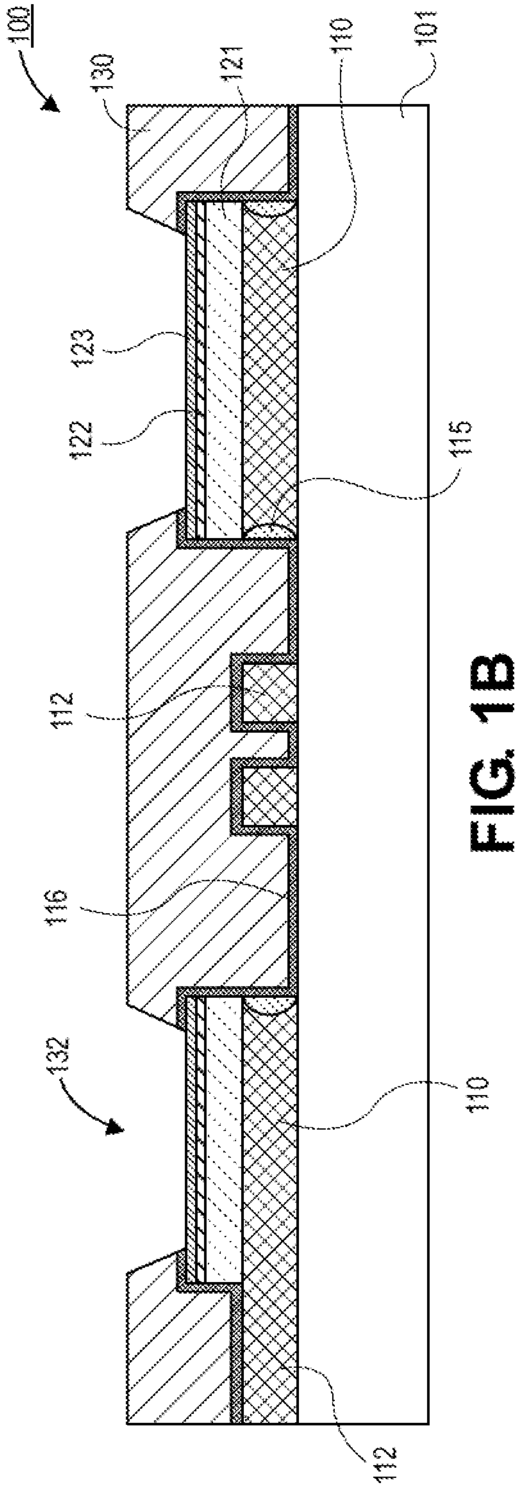
FIG. 1B is a cross-sectional illustration of a package substrate with a glass core and surface finishes over the pads, where the pads have an undercut, in accordance with an embodiment.

Referring now to FIG. 1B, a cross-sectional illustration of a package substrate 100 is shown, in accordance with an additional embodiment. In an embodiment, the package substrate 100 in FIG. 1B may be substantially similar to the package substrate 100 in FIG. 1A, with the exception of the pads 110. Instead of having vertical sidewalls, the pads 110 may have undercuts 115. The undercuts 115 may be curved surfaces. The undercuts 115 may be the result of etching processes used to remove the seed layer (not shown in FIG. 1). The undercuts 115 may be filled with portions of the solder resist 130. However, due to shielding above the undercuts 115 from the pad 110 and the surface finish layers 121-123, the solder resist 130 in the undercuts 115 may have a different structure than the remainder of the solder resist 130. For example, a degree of cross-linking in the solder resist 130 in the undercuts 115 may be different than a degree of cross-linking in the remainder of the solder resist 130.

Referring now to FIGS. 2A-2L, a series of cross-sectional illustrations depicting a process for forming a package substrate 200 is shown, in accordance with an embodiment. In an embodiment, the package substrate 200 may be substantially similar to the package substrate 100 in FIG. 1B. Though, it is to be appreciated that modifications to the process flow may result in different package substrate architectures. Particularly, the package substrate 200 is formed with surface finish layers that are plated using an electrolytic plating process.

Figure 2A:
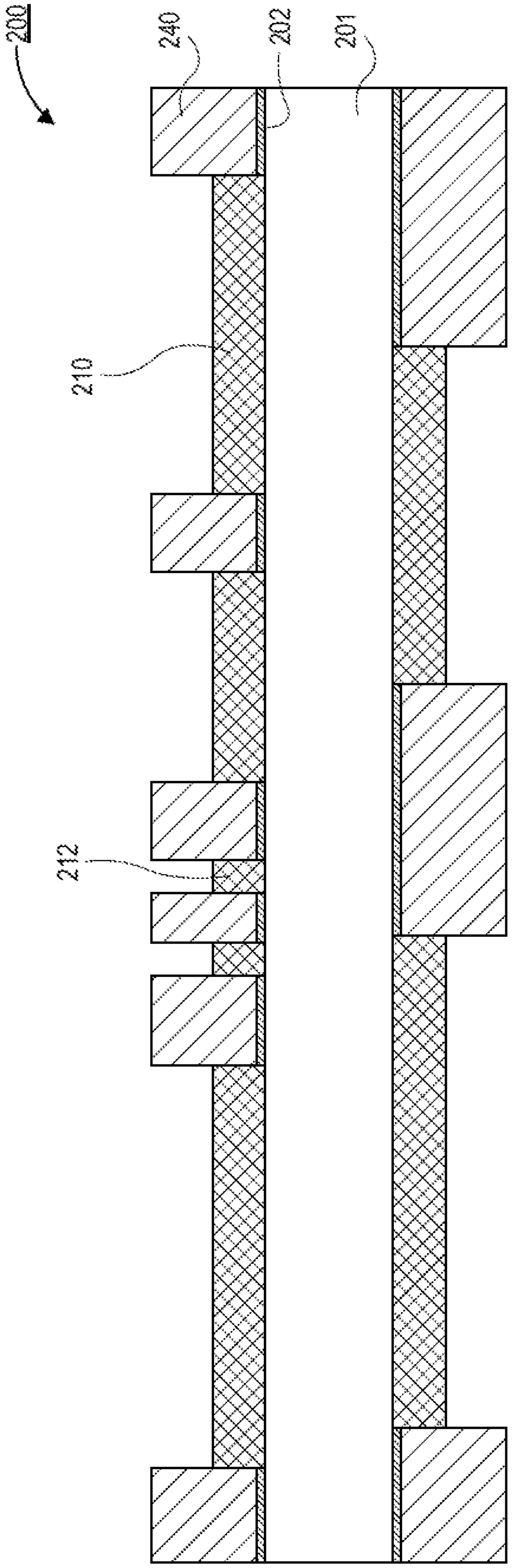
FIGS. 2A-2L are cross-sectional illustrations depicting a process for forming a package substrate with surface finishes that are plated with an electrolytic plating process, in accordance with an embodiment.

Referring now to FIG. 2A, a cross-sectional illustration of a package substrate 200 at a stage of manufacture is shown, in accordance with an embodiment. In an embodiment, the package substrate 200 comprises a core 201. The core 201 may be a glass core in some embodiments. In an embodiment, the core 201 may include one or more buildup layers (not shown) between the pads 210 and the core 201. In other embodiments, the pads 210 may be formed directly on the core 201. The core 201 may include TGVs (not shown) or other conductive features.

In an embodiment, a seed layer 202 is formed over the core 201. The seed layer 202 may be a continuous conductive layer across the core 201. The seed layer 202 may comprise copper and/or titanium in some embodiments. While not shown under the pads 210 or traces 212, it is to be appreciated that the seed layer 202 may also be provided under the pads 210 and traces 212. A seed layer 202 may also be provided below the core 201 in order to form pads 210 and traces 212 on the opposite side of the core 201 as well.

In an embodiment, a first resist layer 240 is provided over and under the core 201. The first resist layer 240 may be a dry film resist (DFR) or the like. In an embodiment, the first resist layer 240 is patterned in order to form openings. The pads 210 and traces 212 may then be selectively plated in the openings (e.g., with an electrolytic plating process). The first resist layer 240 prevents plating in regions where the pads 210 and/or traces 212 are not desired.

Figure 2B:
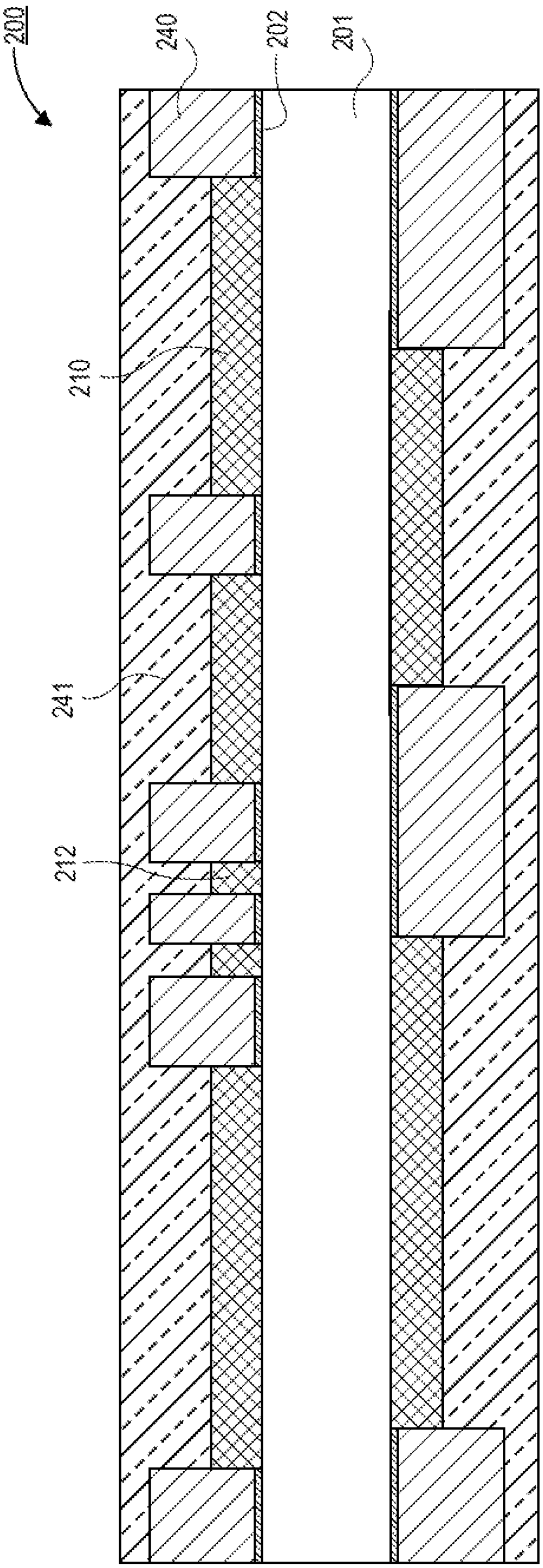

Referring now to FIG. 2B, a cross-sectional illustration of the package substrate 200 after a second resist layer 241 is applied over the first resist layer 240, the pads 210, and the traces 212. The second resist layer 241 may also be a DFR. In some embodiments, the first resist layer 240 is a material that is etch resistant to the second resist layer 241. The second resist layer 241 may be photoimageable dielectric (PID) in some embodiments. That is, the second resist layer 241 may be directly exposed and developed without the need of an overlying mask layer.

Figure 2C:
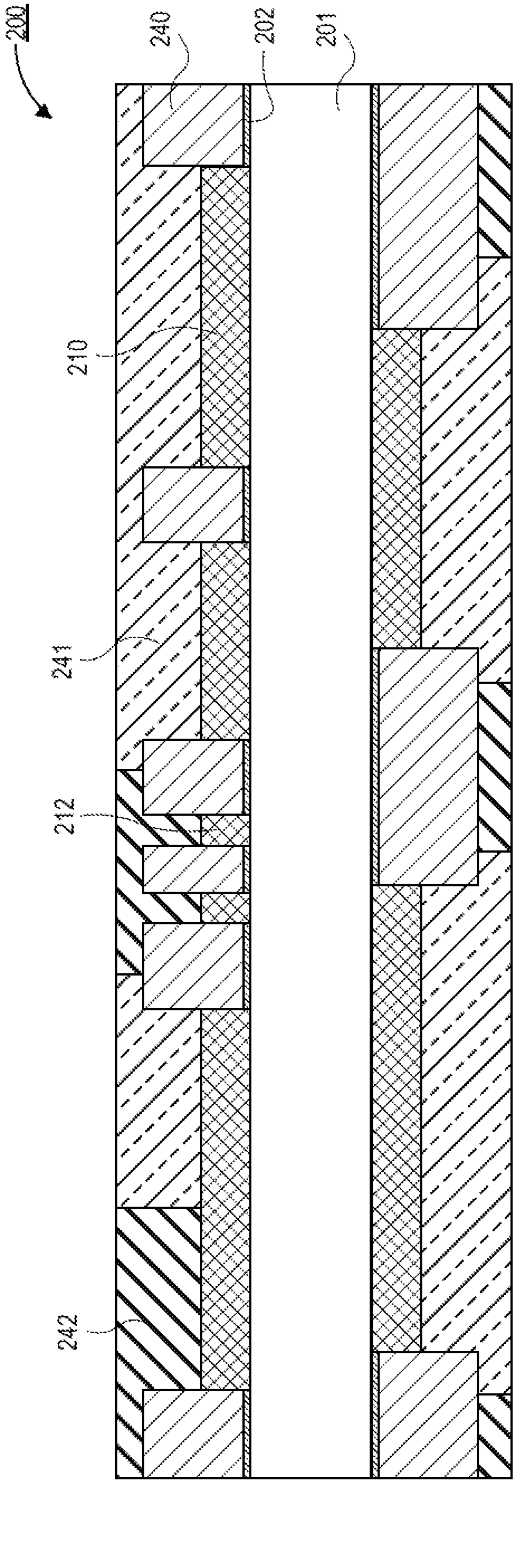

Referring now to FIG. 2C, a cross-sectional illustration of the package substrate 200 after the second resist layer 241 is exposed is shown, in accordance with an embodiment. The exposure may result in a chemical or structural change in the second resist layer 241. As shown, exposed regions 242 may be provided in the second resist layer 241. The exposed regions 242 may be etch resistant to the unexposed regions of the second resist layer 241. As such, the exposed regions 242 may remain after a developing process. In an embodiment, the exposed regions 242 may be provided over the traces 212 and/or other regions outside of the pads 210. That is, when the unexposed regions of the second resist layer 241 are removed, only the pads 210 will remain exposed.

Figure 2D:
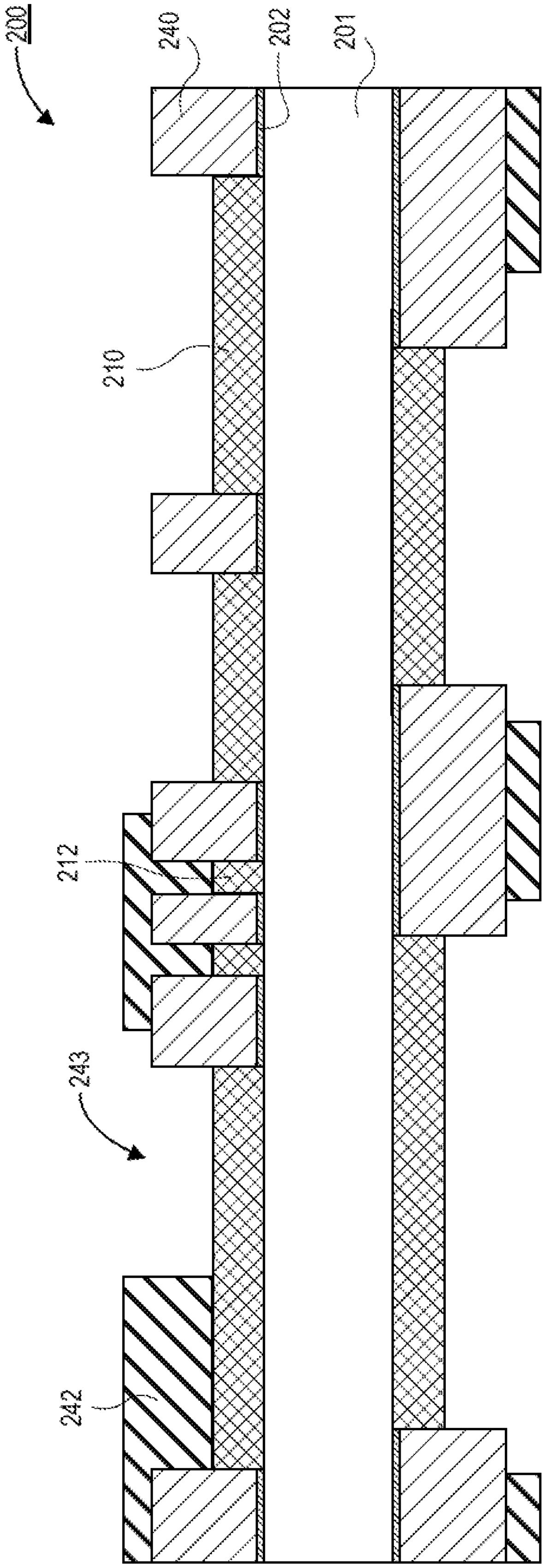

Referring now to FIG. 2D, a cross-sectional illustration of the package substrate 200 after the unexposed regions of the second resist layer 241 are removed is shown, in accordance with an embodiment. As shown, the first resist layer 240 and the exposed regions 242 of the second resist layer 241 provide a mask that only exposes the pads 210 above and below the core 201.

Figure 2E:
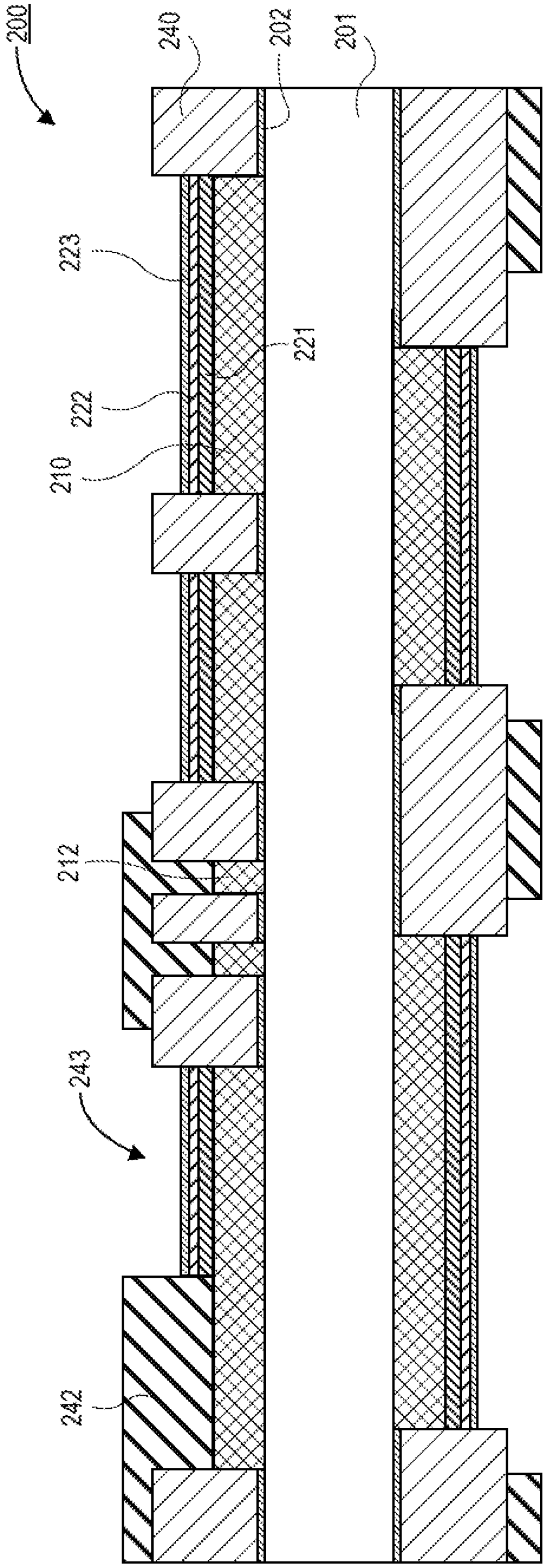

Referring now to FIG. 2E, a cross-sectional illustration of the package substrate 200 after the surface finish layers 221-223 are applied over the pads 210 is shown, in accordance with an embodiment. In an embodiment, the surface finish layers 221-223 may have a width that is substantially equal to a width of the pads 210. This is because the original first resist layer 240 that was used to pattern the pads 210 is also used to define the shape of the surface finish layers 221-223.

While shown as three distinct surface finish layers 221-223, it is to be appreciated that the surface finish layers 221-223 may include one or more layers. In an embodiment, the surface finish layers 221-223 may comprise nickel, palladium, and gold. Though other metals, alloys, or the like may be used for the surface finish layers 221-223. The surface finish layers 221-223 may be plated with an electrolytic plating process. Particularly, the seed layer 202 remains present and allows for the surface finish layers 221-223 to be plated up from the exposed pads 210.

Figure 2F:
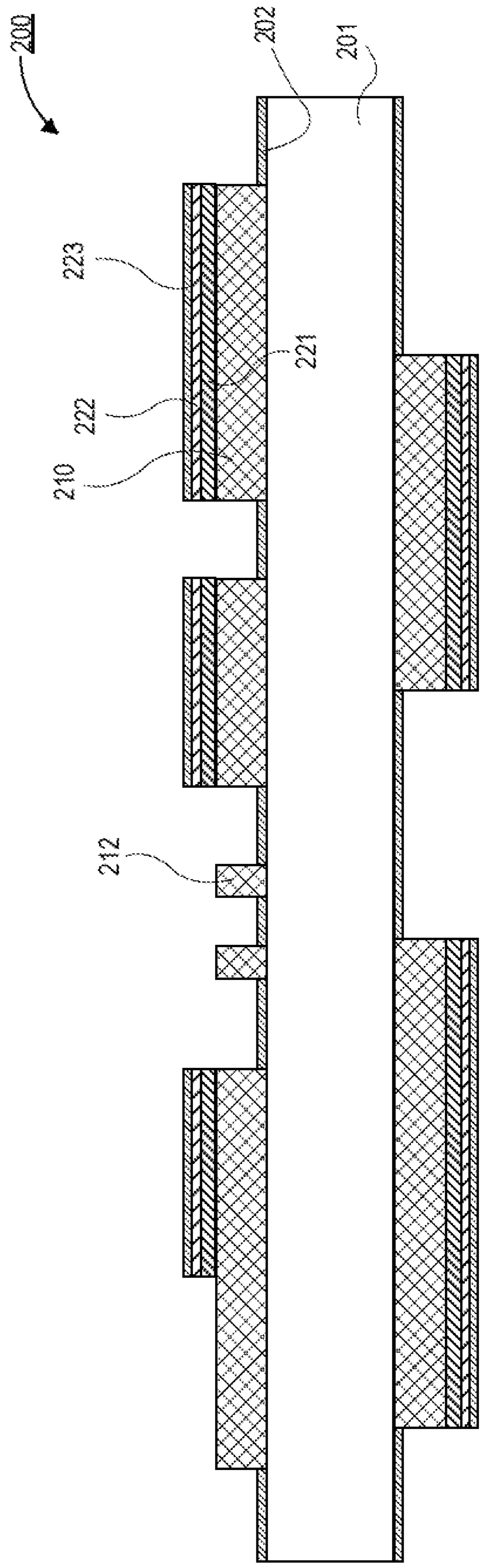

Referring now to FIG. 2F, a cross-sectional illustration of the package substrate 200 after the resist layers 240 and 242 are removed is shown, in accordance with an embodiment. The resist layers 240 and 242 may be removed with a resist stripping process, an etching process, or the like. In an embodiment, removal of the resist layers 240 and 242 may result in the exposure of portions of the seed layer 202 between pads 210 and traces 212.

Figure 2G:
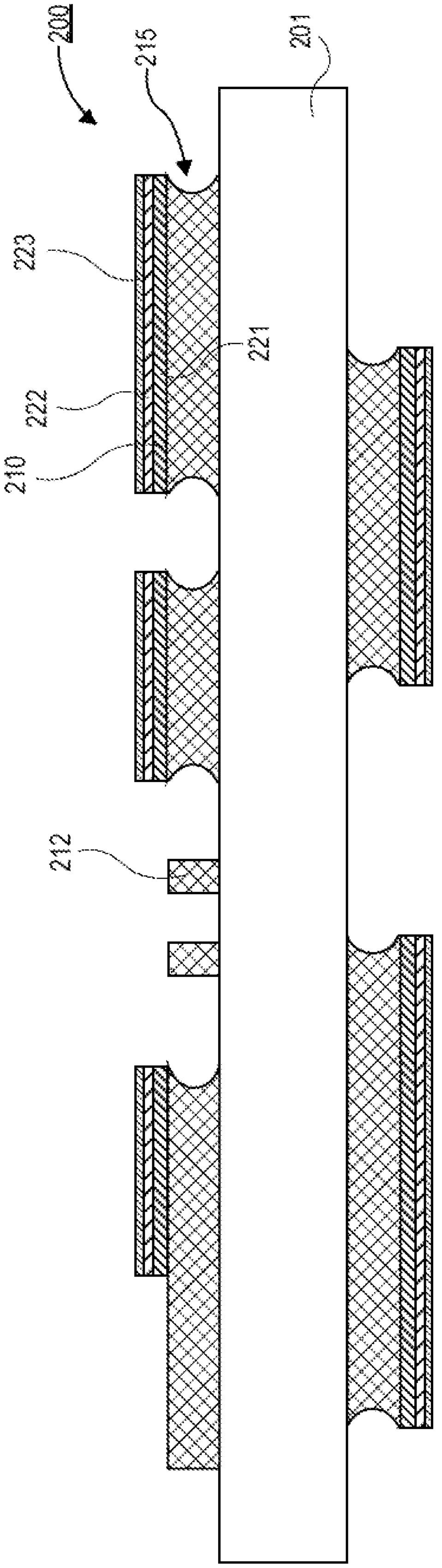

Referring now to FIG. 2G, a cross-sectional illustration of the package substrate 200 after the seed layer 202 is removed is shown, in accordance with an embodiment. In an embodiment, the seed layer 202 may be removed with a flash etching process, such as a timed wet etch. Removal of the seed layer 202 electrically isolates the pads 210 and traces 212 from each other. Additionally, it is to be appreciated that the etching process may also partially etch the pads 210. As shown, undercuts 215 may be provided along the edges of the pads 210. The undercuts 215 may have curved surfaces that extend into a width of the pads 210. The depth of the undercuts 215 may be set by the duration of the etching process used to remove the seed layer 202. The undercuts 215 in FIG. 2G may be exaggerated for illustrative purposes. For example, the undercuts 215 may have a small depth (e.g., approximately 5 μm or less, or approximately 1 μm or less).

Figure 2H:
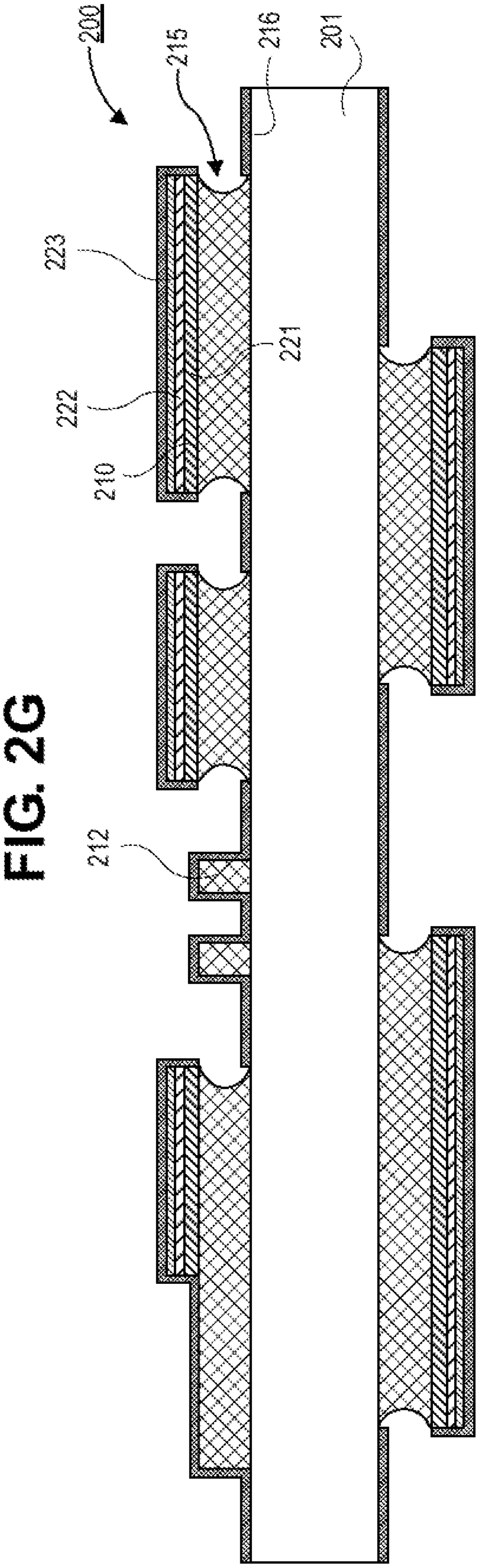

Referring now to FIG. 2H, a cross-sectional illustration of the package substrate 200 after an adhesion promoting layer 216 is applied over surfaces of the package substrate 200 is shown, in accordance with an embodiment. In an embodiment, the adhesion promoting layer 216 may be applied with any suitable deposition process (e.g., chemical vapor deposition (CVD), physical vapor deposition (PVD), or the like). In an embodiment, the adhesion promoting layer 216 may be blanket deposited so that the adhesion promoting layer 216 is over the entire surface (top and bottom) of the package substrate 200. The adhesion promoting layer 216 may include any suitable material that aids in the adhesion of a solder resist layer (which will be added in a subsequent operation) to the traces 212 and pads 210. For example, the adhesion promoting layer 216 may comprise silicon and nitrogen (e.g., silicon nitride). The use of an adhesion promoting layer 216 is particularly important when the traces 212 and pads 210 cannot be roughened with a surface roughening etch process.

Figure 2I:
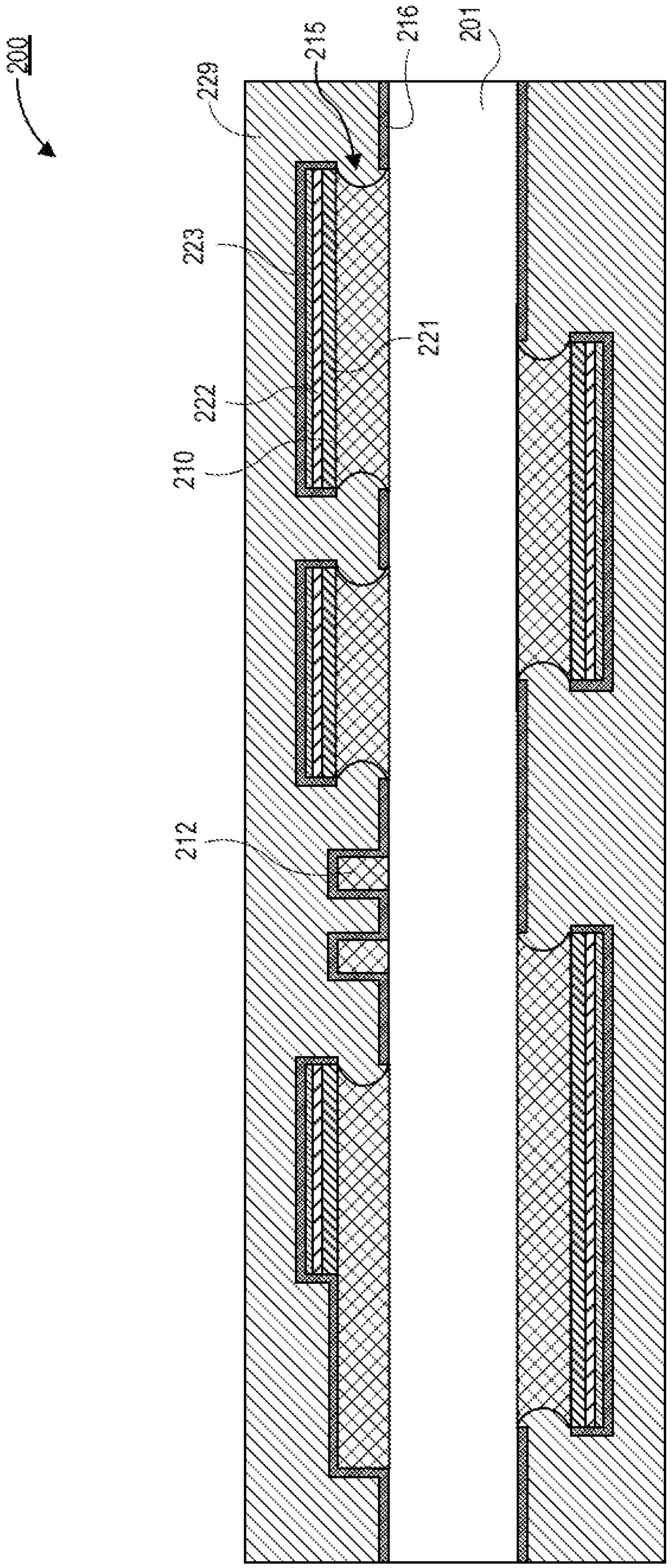

Referring now to FIG. 2I, a cross-sectional illustration of the package substrate 200 after solder resist layers 229 are provided over the top and bottom surface of the package substrate 200 is shown, in accordance with an embodiment. In an embodiment, the solder resist layers 229 may be applied with a lamination process or any other suitable deposition process. The solder resist layers 229 may be provided over the adhesion promoting layer 216. Additionally, portions of the solder resist layers 229 may fill the undercuts 215 formed into the sidewalls of the pads 210. The thicknesses of the solder resist layers 229 may be greater than a thickness of the pads 210 and traces 212.

Figure 2J:
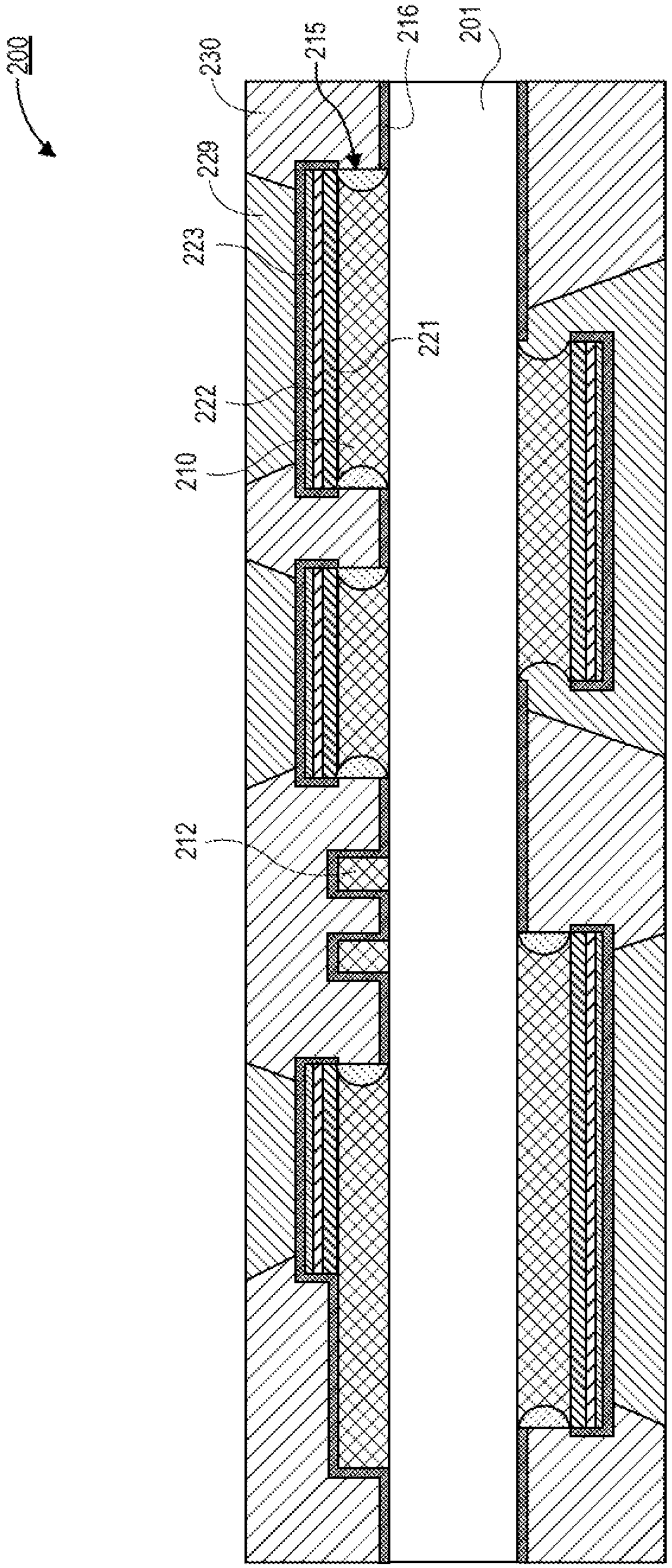

Referring now to FIG. 2J, a cross-sectional illustration of the package substrate 200 after the solder resist layers 229 are exposed is shown, in accordance with an embodiment. In an embodiment, the exposure results in the formation of exposed solder resist layers 230. The exposed solder resist layers 230 may have a material composition or material structure that is different than the unexposed solder resist layers 229. For example, a degree of cross-linking in the solder resist layers 230 may be different than a degree of cross-linking in the solder resist layers 229. Additionally, it is to be appreciated that the solder resist material in the undercuts 215 may also have the same structure or material composition as the unexposed solder resist layers 229. This is because the overlying pads 210 and surface finish layers 221-223 block the radiation. Additionally, an opposite exposure process may be used, where the solder resist layers 229 are exposed, and the solder resist layers 230 are unexposed.

Figure 2K:
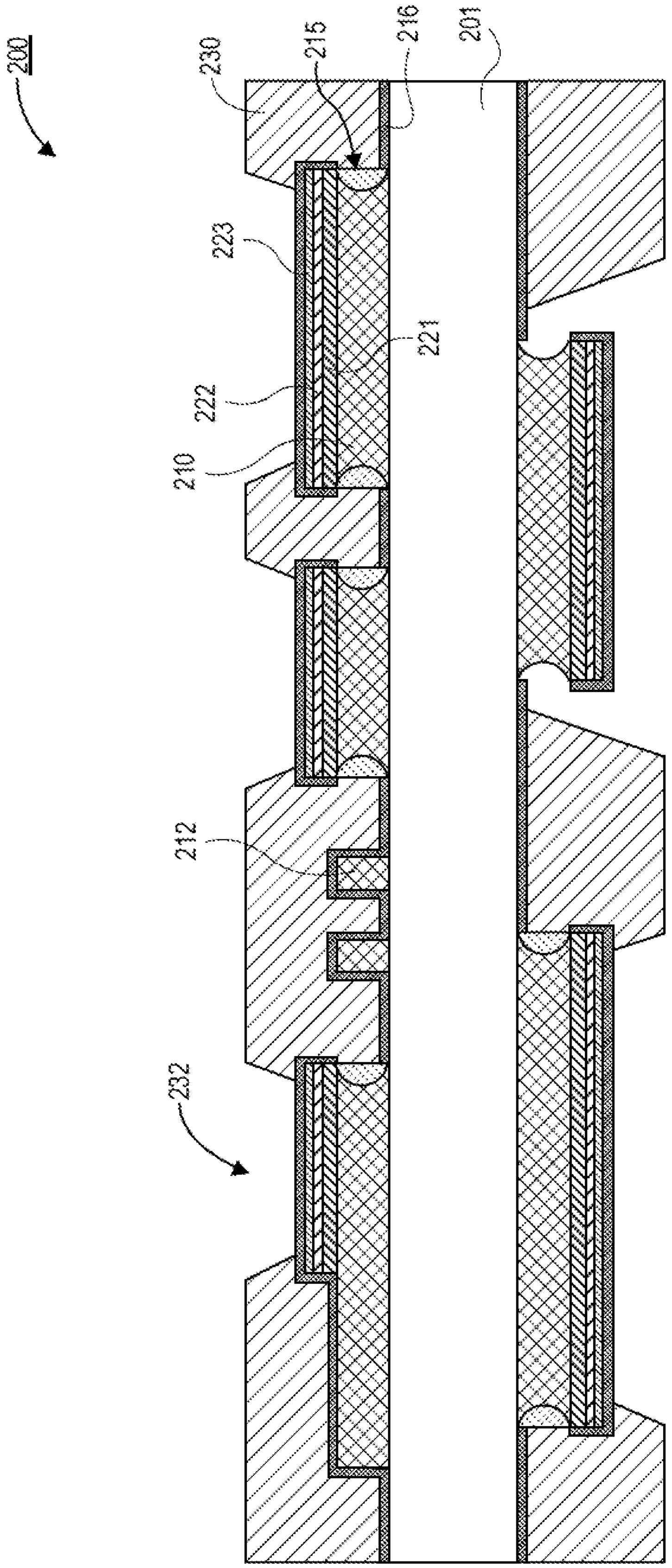

Referring now to FIG. 2K, a cross-sectional illustration of the package substrate 200 after the solder resist layers 229 are removed is shown, in accordance with an embodiment. The removal of solder resist layers 229 results in the formation of solder resist openings 232. The solder resist openings 232 may be provided over the pads 210. The solder resist openings 232 may have a width that is narrower than a width of the surface finish layers 221-223. This is different than an electroless plating process, where the surface finish is only provided in the opening of the solder resist openings 232. In the majority of the pads 210, the solder resist opening 232 lands over a top surface of the pads 210. These pads may be considered to be solder resist defined pads. However, in other embodiments (e.g., the bottom right pad), the solder resist opening 232 may be wider than the pad 210. Such a pad may be considered a metal defined pad. In the illustrated embodiment, both solder defined pads and metal defined pads are used. However, in other embodiments, only solder defined pads, or only metal defined pads may also be used.

Figure 2L:
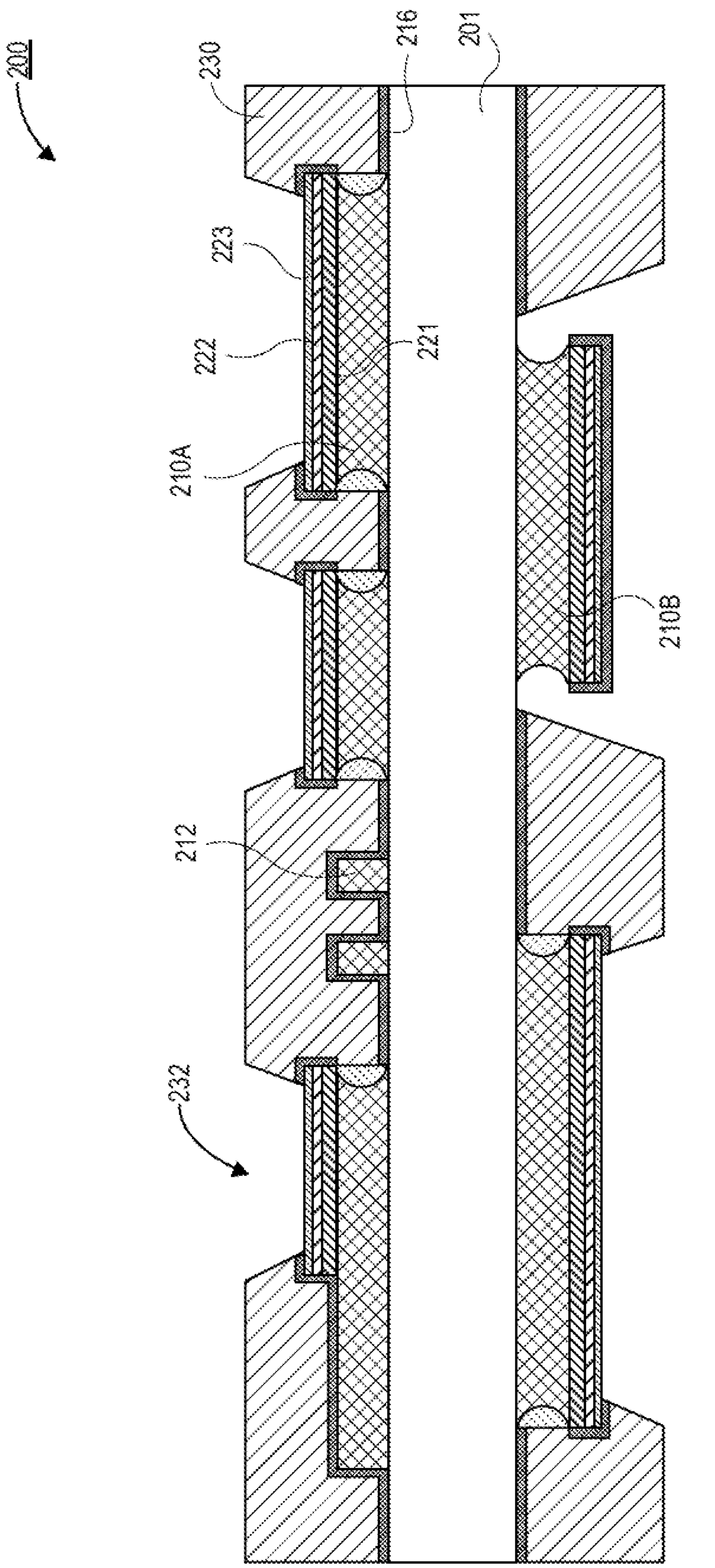

Referring now to FIG. 2L, a cross-sectional illustration of the package substrate 200 after portions of the adhesion promoting layer 216 are removed is shown, in accordance with an embodiment. In an embodiment, the adhesion promoting layer 216 may be removed from the solder resist openings 232 in order to expose the underlying surface finish layer 223. The adhesion promoting layer 216 may be removed with a dry etching process, a descumming process, or the like. Since the removal of the adhesion promoting layer 216 is confined to the solder resist openings 232, some portion of the adhesion promoting layer 216 may remain on the top surface of the pads 210. For example, in solder defined pads, a small portion of the adhesion promoting layer 216 remains on the outer edges of the pads 210A. In contrast, in a metal defined pad (i.e., the bottom right pad 210B), the adhesion promoting layer 216 may be removed from an entire top surface of the pad 210B and from the core 201 (or buildup layers) immediately adjacent to the pad 210B.

Figure 3A:
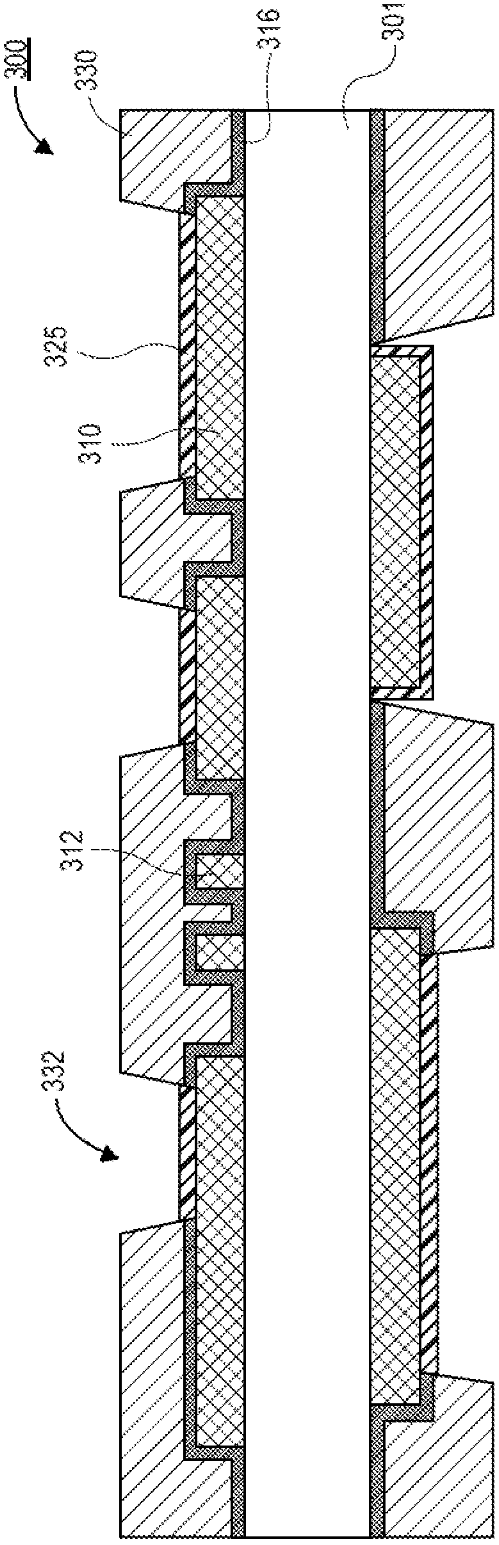
FIG. 3A is a cross-sectional illustration of a package substrate with a glass core and a surface finish disposed over pads, in accordance with an embodiment.

Referring now to FIG. 3A, a cross-sectional illustration of a package substrate 300 is shown, in accordance with an additional embodiment. In an embodiment, the package substrate 300 comprises a core 301. The core 301 may be a glass core 301 in some embodiments. Buildup layers (not shown) may be provided above and/or below the core 301. In an embodiment, pads 310 and traces 312 may then be provided over and/or under the core 301. The pads 310 and traces 312 may be formed with an electrolytic plating process. In an embodiment, an adhesion promoting layer 316 may be provided between the core 301 and solder resist layers 330. The adhesion promoting layer 316 may also be provided over and around the pads 310 and the traces 312. The adhesion promoting layer 316 may comprise silicon and nitrogen (e.g., silicon nitride). In an embodiment, solder resist openings 332 may be provided through the solder resist layers 330 in order to expose the pads 310.

In an embodiment, a surface finish layer 325 is provided over the pads 310. While shown generally as a single layer, it is to be appreciated that the surface finish layer 325 may include two or more layers in some embodiments. In a particular embodiment, the surface finish layer 325 may comprise a nickel layer, a palladium layer, and a gold layer. Though, other metals, alloys, or the like may be used in the surface finish layer 325. In an embodiment, the surface finish layer 325 may be provided only over the surface of the pads 310 exposed by the solder resist openings 332. That is, a width of the surface finish layer 325 may be substantially similar to a width of the solder resist openings 332. The remaining top surfaces of the pads 310 may be covered by the adhesion promoting layer 316. In the case of a metal defined pad (e.g., the bottom right pad 310), the surface finish layer 325 may be provided over a bottom surface and sidewall surfaces of the pad 310.

Figure 3B:
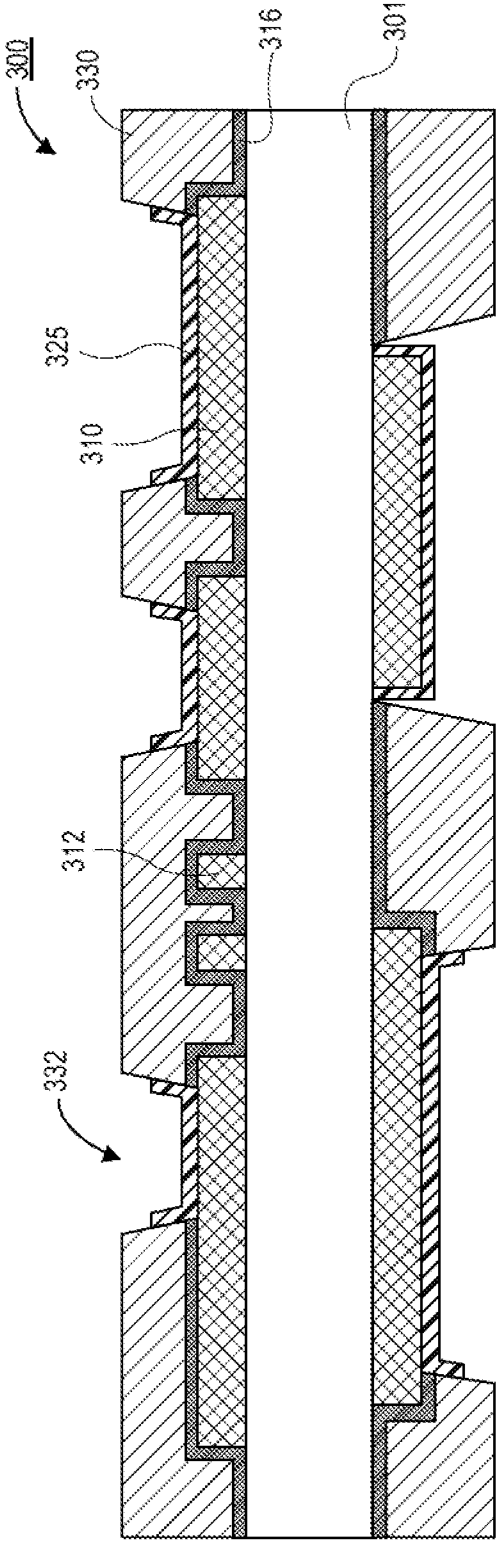
FIG. 3B is a cross-sectional illustration of a package substrate with a glass core and a surface finish that extends up sidewalls of the solder resist opening, in accordance with an embodiment.

Referring now to FIG. 3B, a cross-sectional illustration of a package substrate 300 is shown, in accordance with an additional embodiment. The package substrate 300 in FIG. 3B may be substantially similar to the package substrate 300 in FIG. 3A, with the exception of the formation of the surface finish layer 325. Instead of only being provided directly over the pads 310, the surface finish layer 325 may extend up sidewalls of the solder resist openings 332. The extension up the sidewalls of the solder resist openings 332 may be the result of the patterning process used to form the surface finish layer 325. As will be described in greater detail below, a resist layer is tented across the solder resist openings 332. The length of the surface finish layer 325 on the sidewall of the solder resist openings 332 depends on the degree of tenting. In the embodiment shown in FIG. 3B, the resist layer is tented across the solder resist opening 332 so that the resist layer contacts the upper sidewalls of the solder resist opening. As such, the surface finish layer 325 is only provided over the lower half of the sidewalls of the solder resist opening 332.

Figure 3C:
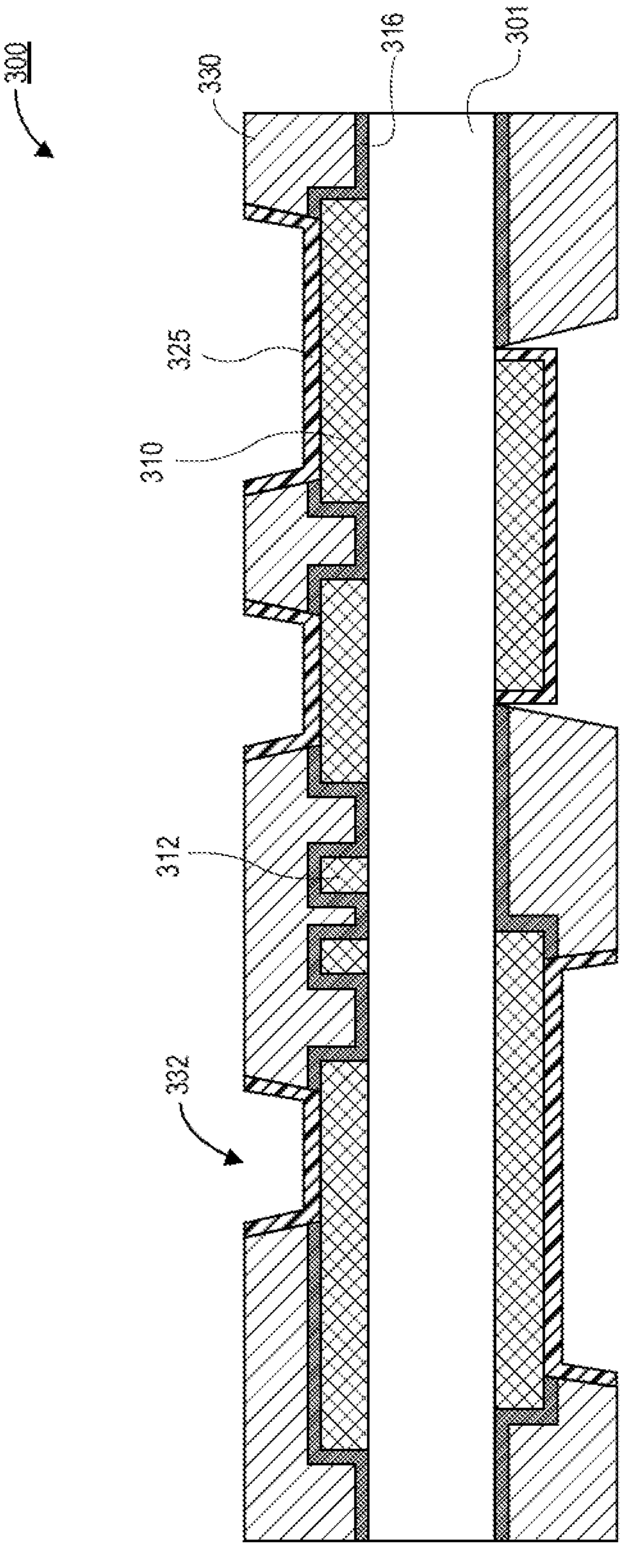
FIG. 3C is a cross-sectional illustration of a package substrate with a glass core and a surface finish that extends entirely up sidewalls of the solder resist opening, in accordance with an embodiment.

Referring now to FIG. 3C, a cross-sectional illustration of a package substrate 300 is shown, in accordance with an additional embodiment. In an embodiment, the package substrate 300 in FIG. 3C is substantially similar to the package substrate 300 in FIG. 3B, with the exception of the surface finish layer 325. Instead of stopping partially up the sidewalls of the solder resist openings 332, the surface finish layers 325 extend entirely up the sidewalls of the solder resist openings 332. This embodiment is enabled when the resist layer (not shown) is fully tented across the solder resist openings 332. That is, the resist layer does not contact any portions of the sidewalls of the solder resist openings 332.

Referring now to FIGS. 4A-4L, a series of cross-sectional illustrations depicting a process for forming a package substrate 400 is shown, in accordance with an embodiment. In an embodiment, the package substrate 400 may be substantially similar to the package substrate 300 described in FIG. 3B. However, it is to be appreciated that the package substrates 300 in FIG. 3A and FIG. 3C may also be formed using similar processing operations with minor modifications.

Figure 4A:
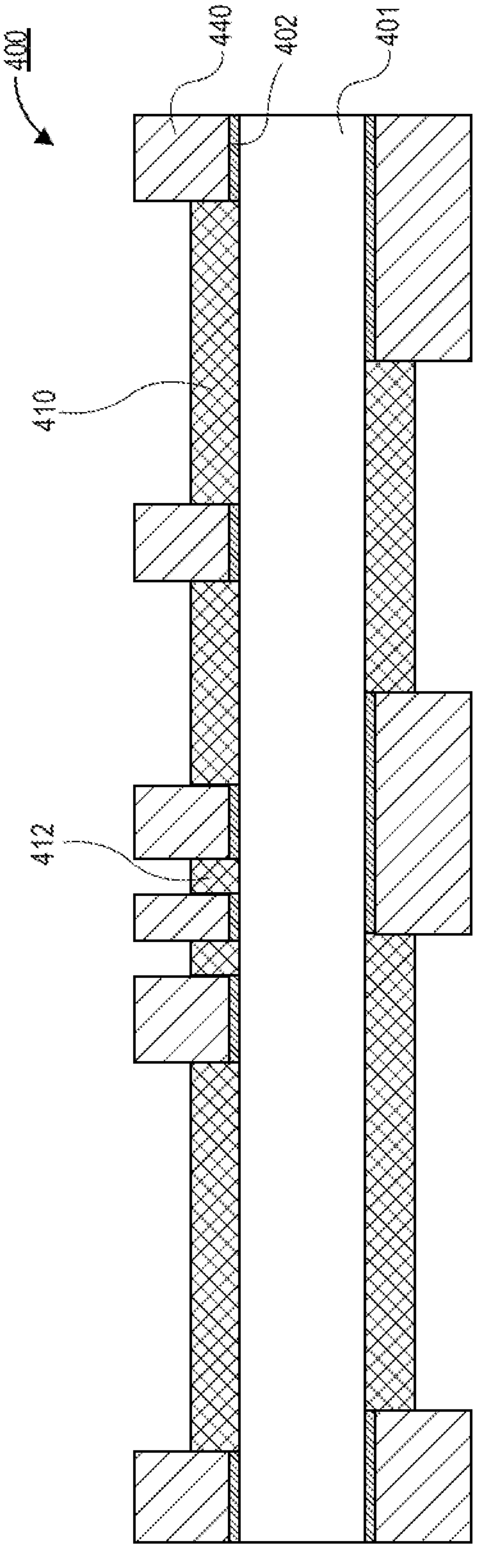
FIGS. 4A-4L are cross-sectional illustrations depicting a process for forming a package substrate with surface finishes that are plated with an electrolytic plating process, in accordance with an additional embodiment.

Referring now to FIG. 4A, a cross-sectional illustration of a package substrate 400 at a stage of manufacture is shown, in accordance with an embodiment. In an embodiment, the package substrate 400 comprises a core 401. The core 401 may be a glass core in some embodiments. In an embodiment, the core 401 may include one or more buildup layers (not shown) between the pads 410 and the core 401. In other embodiments, the pads 410 may be formed directly on the core 401. The core 401 may include TGVs (not shown) or other conductive features.

In an embodiment, a seed layer 402 is formed over the core 401. The seed layer 402 may be a continuous conductive layer across the core 401. The seed layer 402 may comprise copper and/or titanium in some embodiments. While not shown under the pads 410 or traces 412, it is to be appreciated that the seed layer 402 may also be provided under the pads 410 and traces 412. A seed layer 402 may also be provided below the core 401 in order to form pads 410 and traces 412 on the opposite side of the core 401 as well.

In an embodiment, a first resist layer 440 is provided over and under the core 401. The first resist layer 440 may be a DFR or the like. In an embodiment, the first resist layer 440 is patterned in order to form openings. The pads 410 and traces 412 may then be selectively plated in the openings (e.g., with an electrolytic plating process). The first resist layer 440 prevents plating in regions where the pads 410 and/or traces 412 are not desired.

Figure 4B:
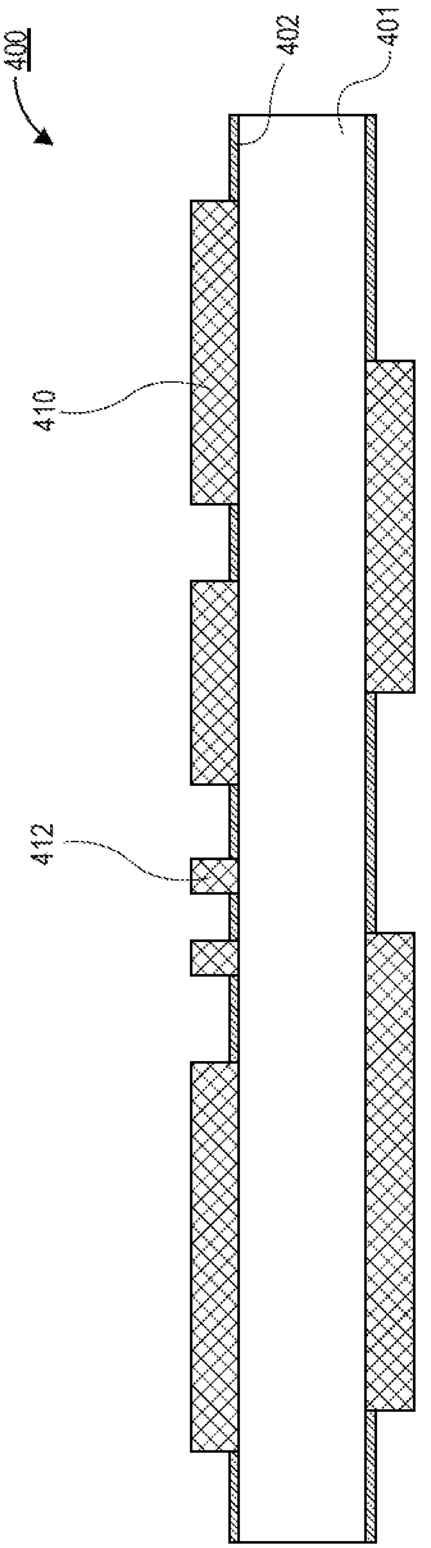

Referring now to FIG. 4B, a cross-sectional illustration of the package substrate 400 after the first resist layer 440 is removed is shown, in accordance with an embodiment. In an embodiment, the first resist layer 440 may be removed with a resist stripping process, an etching process, or the like. Removal of the first resist layer 440 results in the exposure of the seed layer 402 over the core 401. As shown, the seed layer 402 is continuous across the core 401. As such, at this stage of manufacture, the pads 410 and traces 412 are all electrically coupled to each other.

Figure 4C:
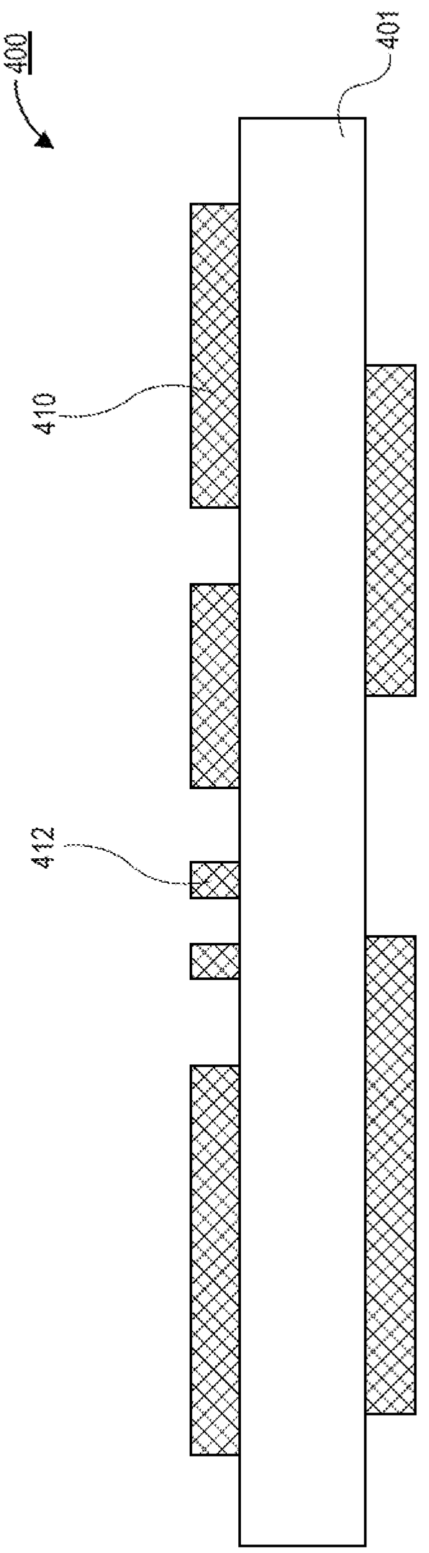

Referring now to FIG. 4C, a cross-sectional illustration of the package substrate 400 after the seed layer 402 is removed is shown, in accordance with an embodiment. In an embodiment, the seed layer 402 may be removed with a flash etching process or the like. Removal of the seed layer 402 electrically isolates the pads 410 and traces 412 from each other. In some embodiments, the etching process to remove the seed layer 402 may also result in an undercut into the sides of the pads 410. For simplicity, the undercut is not shown in the process flow of FIGS. 4A-4L.

Figure 4D:
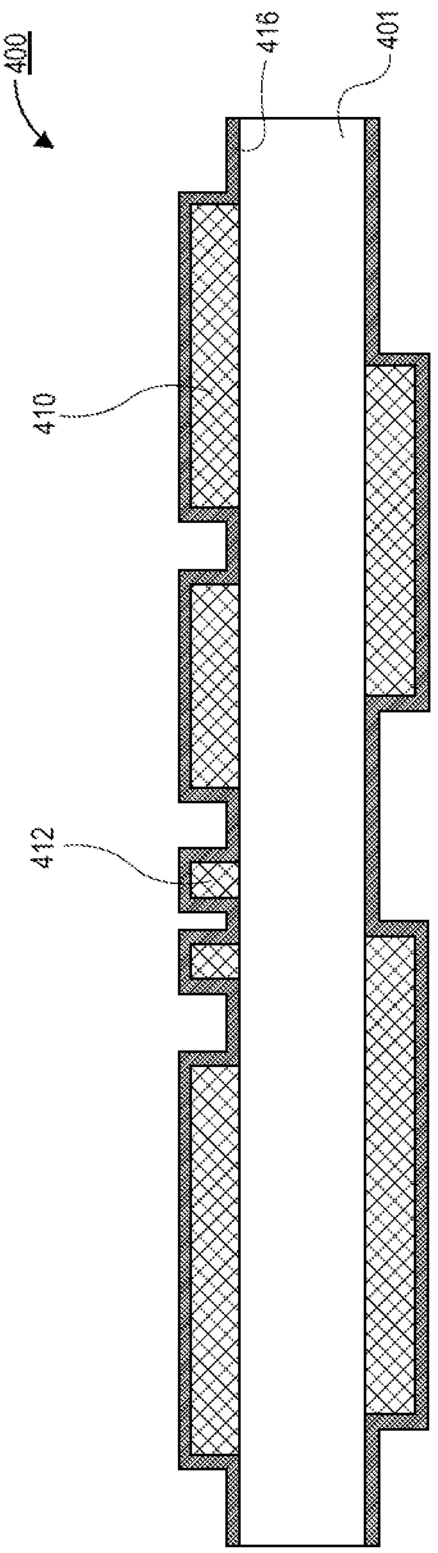

Referring now to FIG. 4D, a cross-sectional illustration of the package substrate 400 after an adhesion promoting layer 416 is applied over and under the core 401 is shown, in accordance with an embodiment. The adhesion promoting layer 416 may be applied with a blanket deposition process. That is, the adhesion promoting layer 416 is disposed over exposed surfaces without a masking layer or the like. The adhesion promoting layer 416 may be provided over sidewalls and top (or bottom) surfaces of the pads 410 and traces 412. The adhesion promoting layer 416 may also be provided directly over the core 401 (or buildup layers above/below the core 401). The adhesion promoting layer 416 may be used to improve adhesion to an overlying solder resist layer that is deposited in a subsequent processing operation. In an embodiment, the adhesion promoting layer may be deposited with any suitable deposition process (e.g., CVD, PVD, or the like). In an embodiment, the adhesion promoting layer may comprise silicon and nitrogen (e.g., silicon nitride).

Figure 4E:
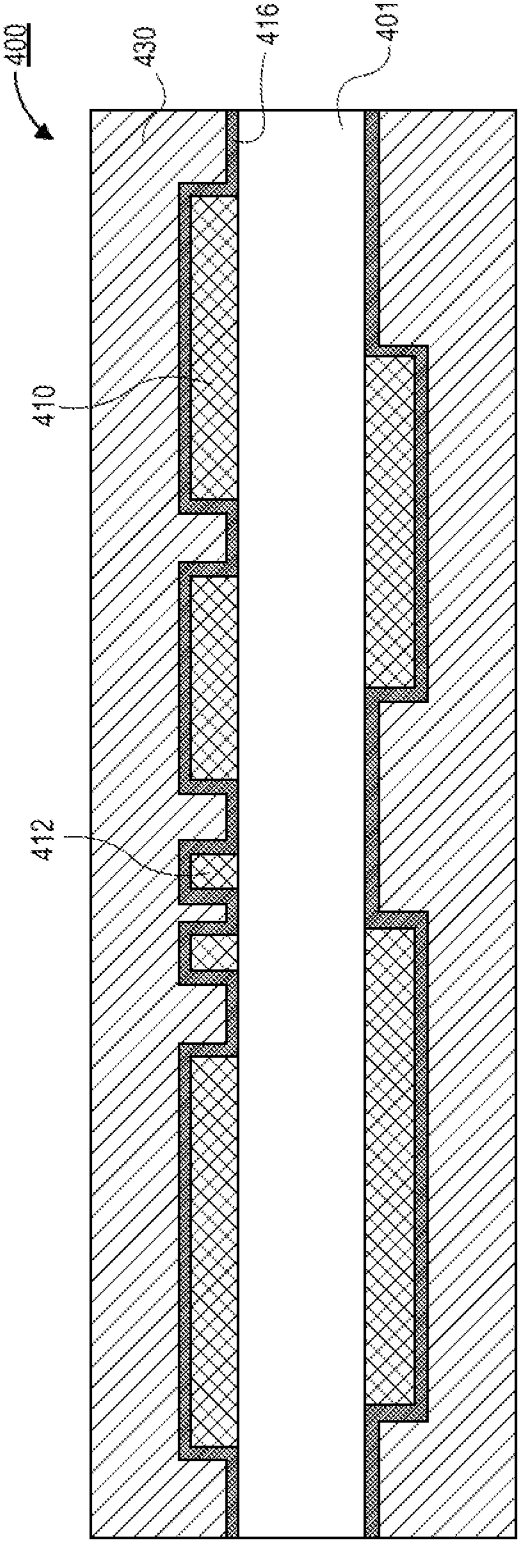

Referring now to FIG. 4E, a cross-sectional illustration of the package substrate 400 after solder resist layers 430 are applied over and under the core 401 is shown, in accordance with an embodiment. The solder resist layers 430 may be applied with a lamination process or the like. The solder resist layers 430 may have a thickness that is greater than thicknesses of the pads 410 and the traces 412. That is, the solder resist layers 430 may be provided over sidewalls and top or bottom surfaces of the pads 410 and traces 412. The solder resist layers 430 may be separated from the pads 410 and the traces 412 by the adhesion promoting layer 416. As such, in some embodiments, there may not be a need to roughen the surfaces of the pads 410 and/or traces 412 in order to improve adhesion.

Figure 4F:
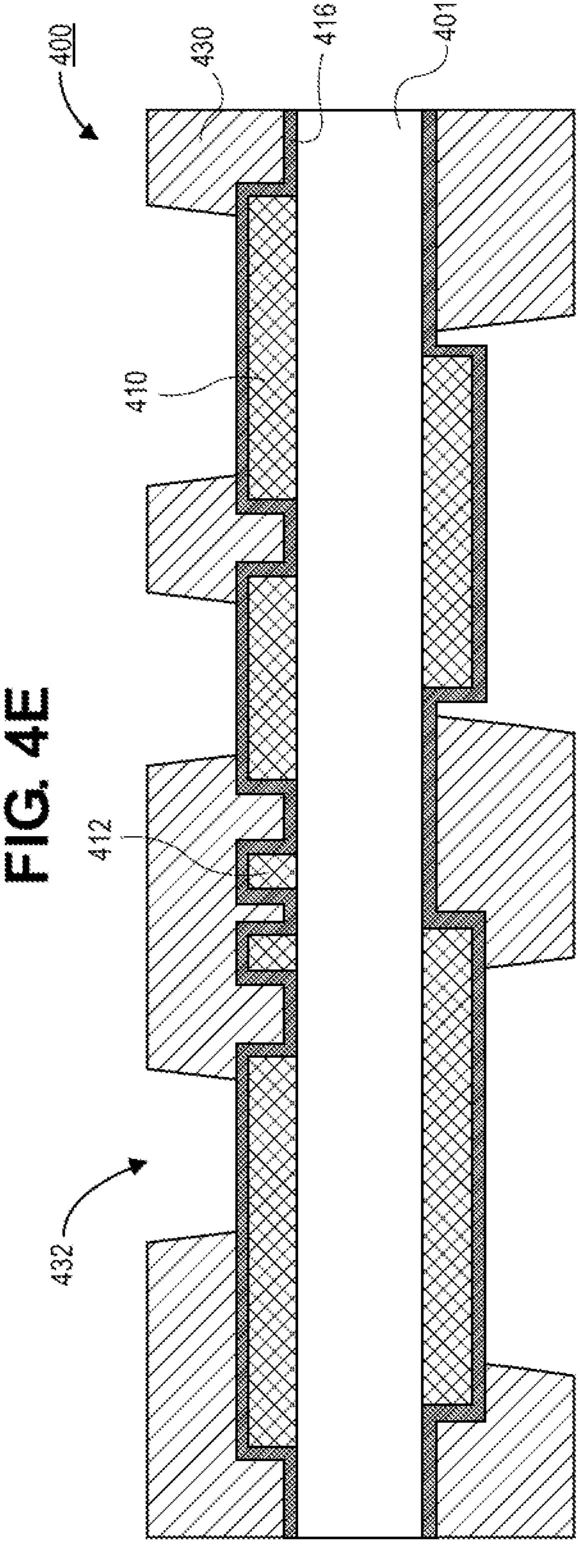

Referring now to FIG. 4F, a cross-sectional illustration of the package substrate 400 after solder resist openings 432 are formed through the solder resist layers 430 is shown, in accordance with an embodiment. In an embodiment, the solder resist openings 432 may be provided over the pads 410. The solder resist openings 432 may have widths that are narrower than the width of the pads 410. Such embodiments may be referred to as solder defined pads 410. In other embodiments, a metal defined pad 410 (e.g., the bottom right pad) may be within a solder resist opening 432 that has a width that is wider than the pad 410. In an embodiment, the solder resist openings 432 expose the adhesion promoting layer 416. That is, the opening process may not remove the adhesion promoting layer 416 in some embodiments.

Figure 4G:
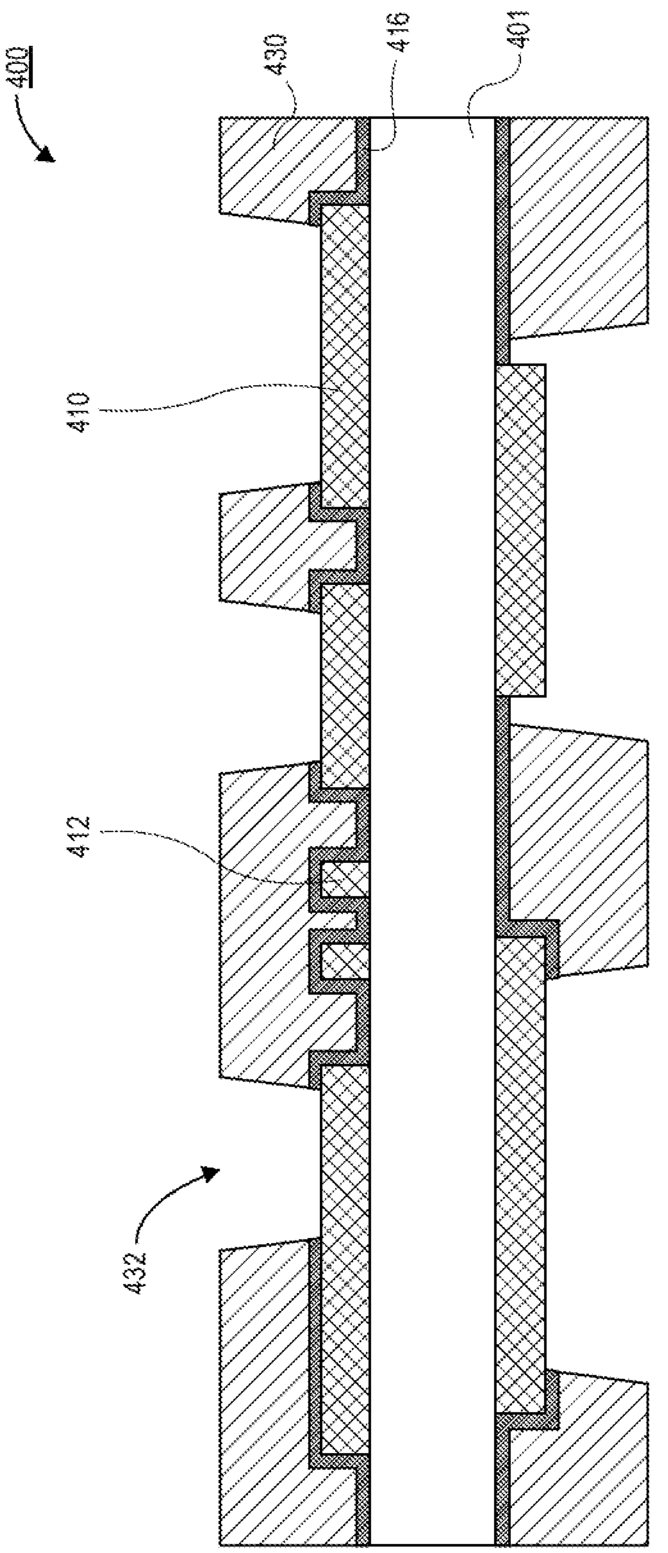

Referring now to FIG. 4G, a cross-sectional illustration of the package substrate 400 after the adhesion promoting layer 416 is etched is shown, in accordance with an embodiment. In an embodiment, portions of the adhesion promoting layer 416 that are exposed by the solder resist openings 432 may be removed. For example, a dry descumming or a dry etching process may be used to remove the adhesion promoting layer 416 from over the pads 410. As such, the metallic surfaces of the pads 410 are exposed in the solder resist openings 432. Additionally, it is to be appreciated that portions of the adhesion promoting layer 416 may remain on the top or bottom surfaces of the pads 410. For example, the edges of the pads 410 may remain covered by the adhesion promoting layer 416. In the case of a metal defined pad 410, the adhesion promoting layer 416 may be completely removed from the pad 410.

Figure 4H:
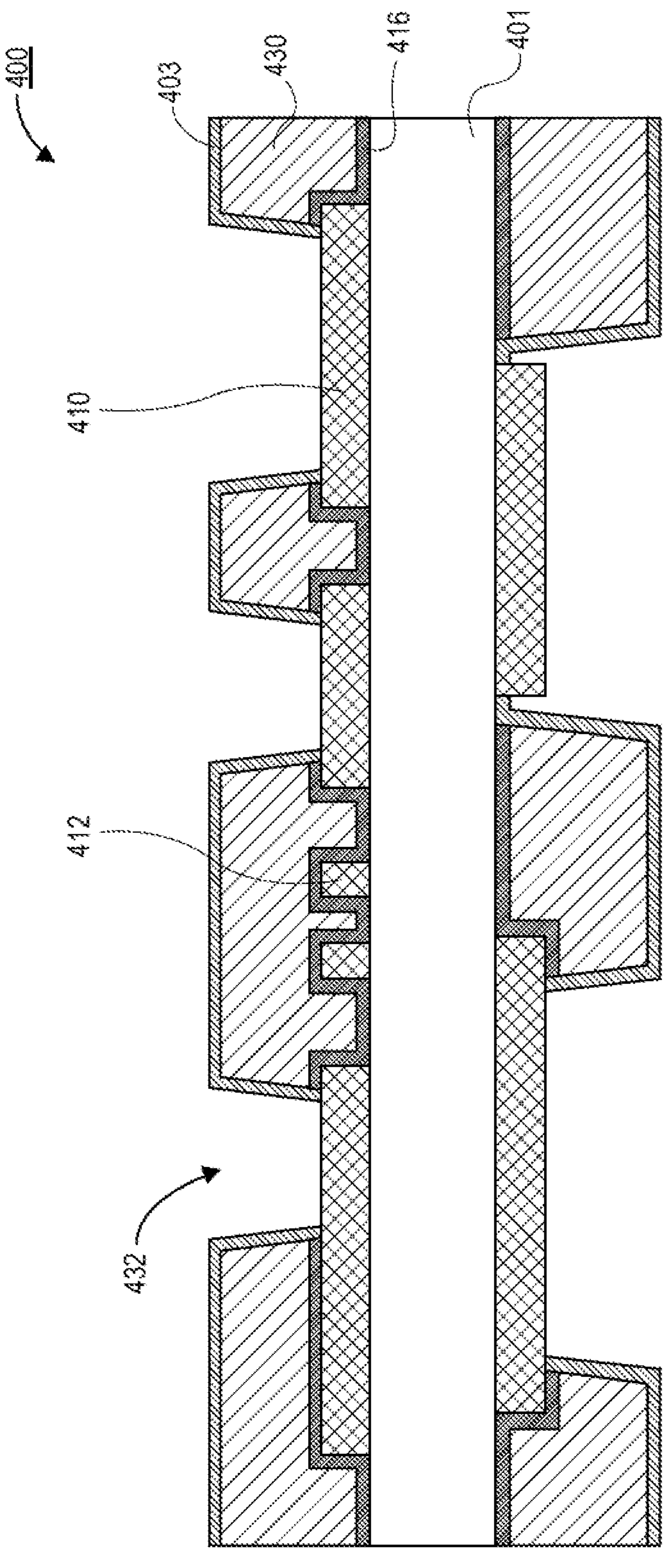

Referring now to FIG. 4H, a cross-sectional illustration of the package substrate 400 after a second seed layer 403 is deposited over the package substrate 400 is shown, in accordance with an embodiment. In an embodiment, the second seed layer 403 may comprise copper and/or titanium. The second seed layer 403 may be blanket deposited over the package substrate 400. For example, a sputtering process or the like may be used to deposit the second seed layer 403. The second seed layer 403 may be deposited over the exposed surfaces of the solder resist layers 430. That is, top or bottom surfaces of the solder resist layers 430 and sidewall surfaces of the solder resist openings 432 may be covered by the second seed layer 403. Additionally, while not shown in FIG. 4H, the second seed layer 403 may also be deposited over the exposed surfaces of the pads 410 in the solder resist openings 432.

Figure 4I:
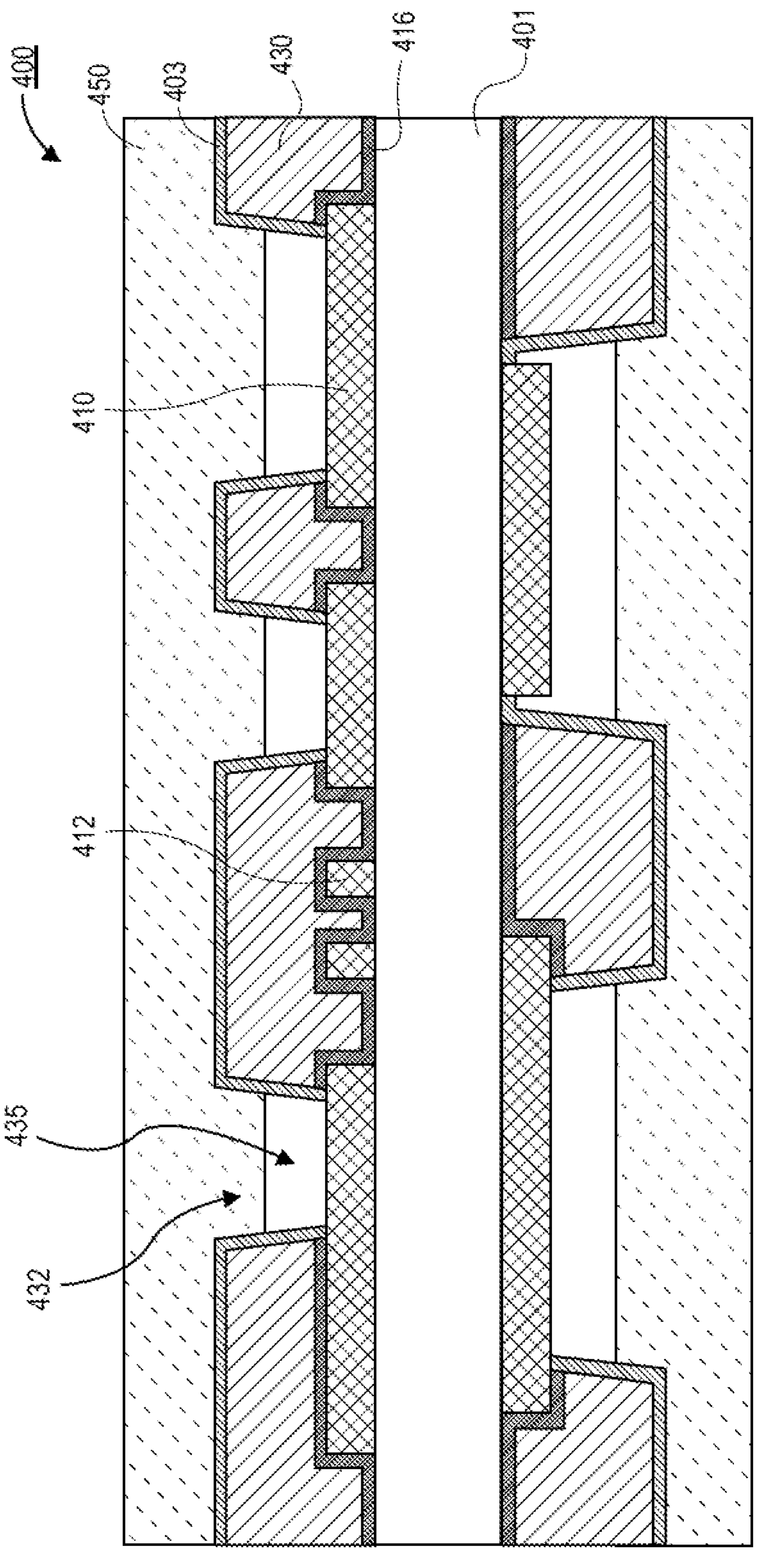

Referring now to FIG. 4I, a cross-sectional illustration of the package substrate 400 after a resist layer 450 is applied over the top and bottom surfaces is shown, in accordance with an embodiment. In an embodiment, the resist layers 450 may be applied so that they tent across the solder resist openings 432. As shown, a gap 435 is provided between an underside of the resist layers 450 and the surfaces of the pads 410. The degree of tenting may dictate the shape of the subsequently formed surface finish layer. For example, in the embodiment shown in FIG. 4I, the resist layer 450 covers a portion of the sidewalls of the solder resist openings 432. Such an embodiment will yield a structure similar to the structure shown in FIG. 3B. Covering more of the sidewalls of the solder resist openings 432 may result in a structure more similar to the embodiment shown in FIG. 3A. Covering less of the sidewalls of the solder resist openings 432 (e.g., covering no portion of the sidewalls) may result in a structure more similar to the embodiment shown in FIG. 3C. The amount of tenting can be controlled by the deposition parameters of the resist layer 450. For example, different deposition temperatures may be used to modulate the degree of tenting of the resist layer 450.

Figure 4J:
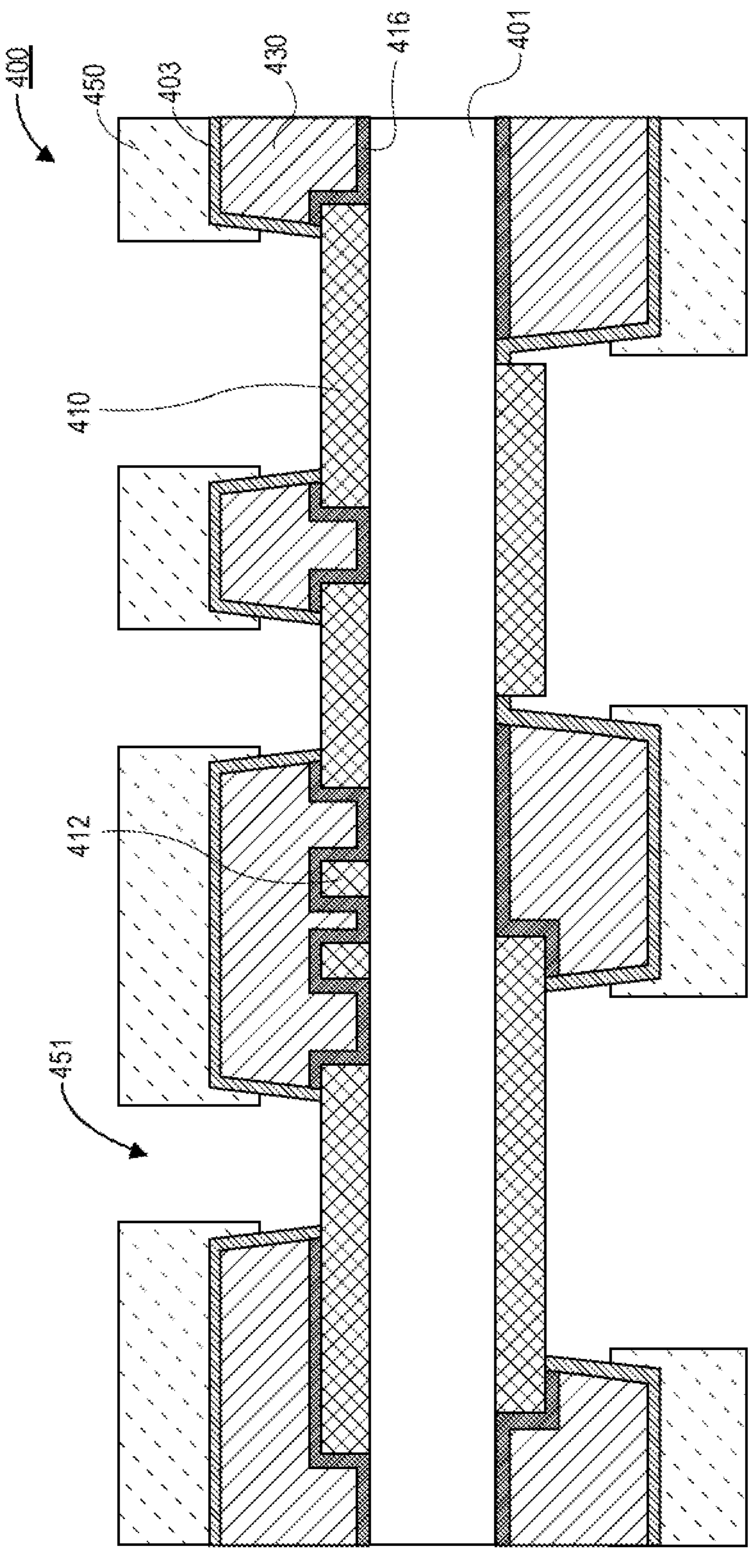

Referring now to FIG. 4J, a cross-sectional illustration of the package substrate 400 after openings 451 are formed in the resist layer 450 is shown, in accordance with an embodiment. In an embodiment, the openings 451 may be aligned over the solder resist openings 432. This allows for the openings 451 to re-expose the pads 410. The openings 451 may also expose portions of the second seed layer 403 in the solder resist openings 432. The openings 451 may be formed with any suitable patterning and etching process.

Figure 4K:
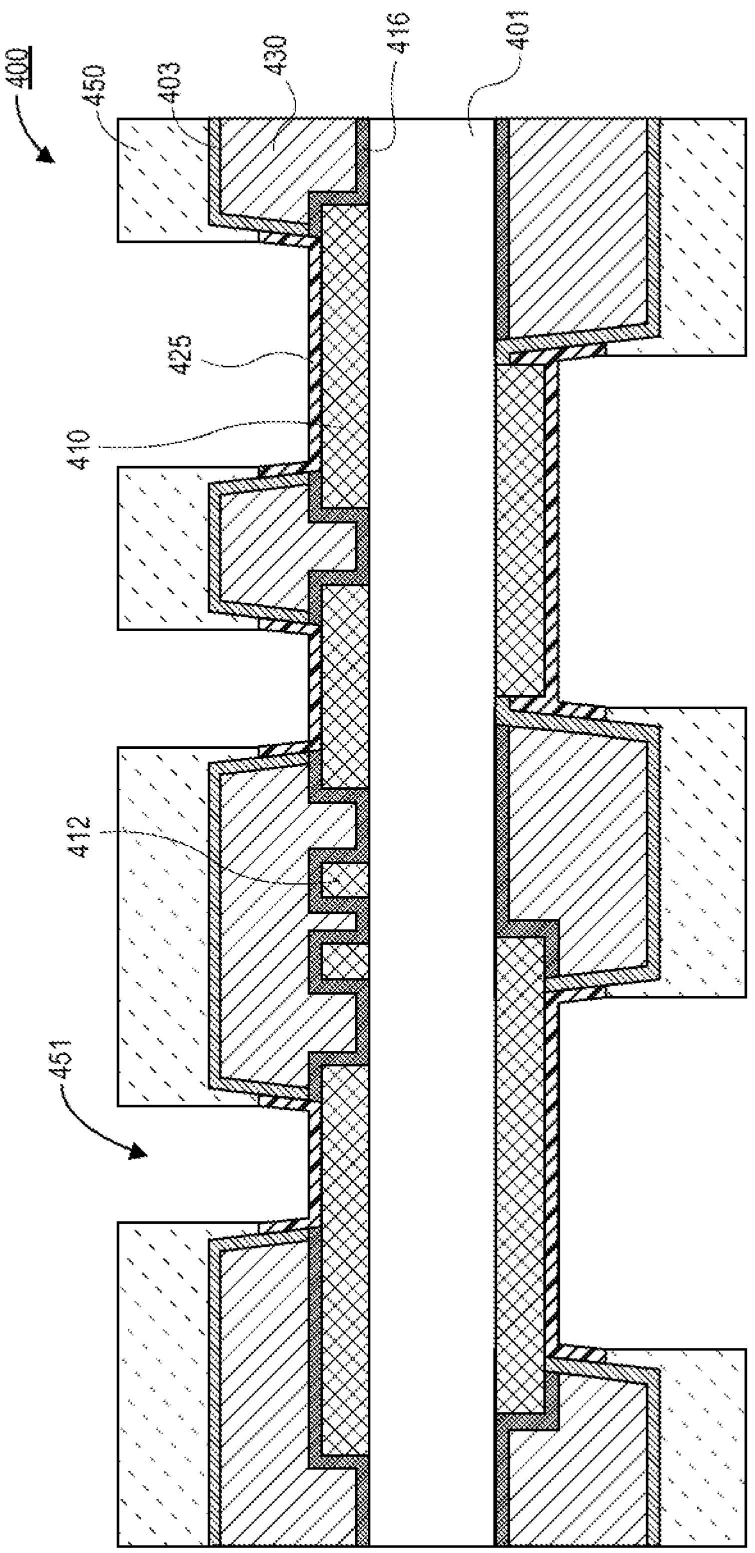

Referring now to FIG. 4K, a cross-sectional illustration of the package substrate 400 after a surface finish layer 425 is formed is shown, in accordance with an embodiment. In an embodiment, the surface finish layer 425 may be deposited with an electrolytic plating process. The second seed layer 403 provides an electrical connection across the package substrate 400. In the illustrated embodiment, the surface finish layer 425 is shown as a single layer. However, embodiments may include two or more surface finish layers 425. For example, the surface finish layer 425 may comprise a layer of nickel, a layer of palladium, and a layer of gold. Though, other materials or alloys may also be included in the surface finish layer 425. Due to the exposed second seed layer 403 on sidewalls of the solder resist openings 432, the surface finish layer 425 may extend up sidewalls of the solder resist openings 432. Such an embodiment may result in the surface finish layer 425 having a U-shaped cross-section. As described above, modifying the degree of tenting of the resist layer 450 results in increasing or decreasing the length of the vertical arms of the surface finish layer 425. In embodiments with a metal defined pad (e.g., bottom right pad 410), the surface finish layer 425 may be provided along an entire bottom surface of the pad 410 and along sidewalls of the pad 410.

Figure 4L:
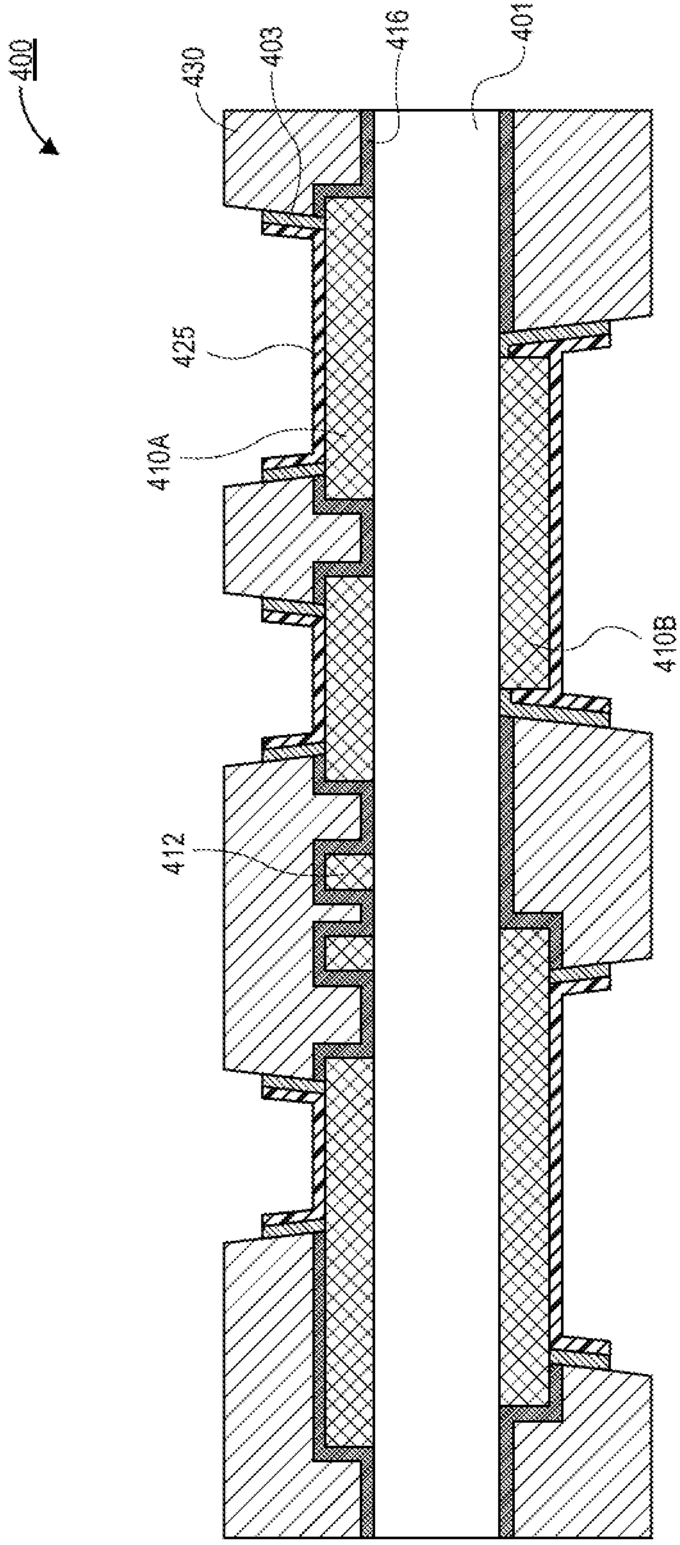

Referring now to FIG. 4L, a cross-sectional illustration of the package substrate 400 after the resist layer 450 is removed is shown, in accordance with an embodiment. In an embodiment, the resist layer 450 may be removed with a resist stripping process or an etching process. FIG. 4L also shows the etching of the second seed layer 403. Particularly, the second seed layer 403 may be etched with a flash etching process or the like. As such, the pads 410 are electrically isolated from each other. In an embodiment, pads 410A may be solder defined pads 410, and pad 410B may be a metal defined pad 410.

Figure 5:
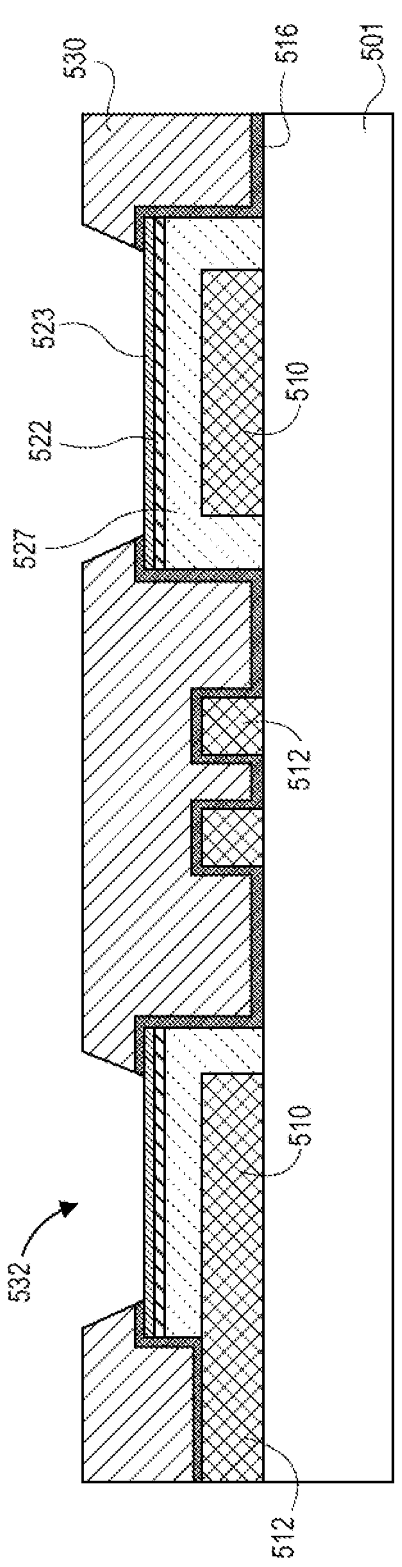
FIG. 5 is a cross-sectional illustration of a package substrate with a glass core and pads that include a shell and a surface finish, in accordance with an embodiment.

Referring now to FIG. 5, a cross-sectional illustration of a portion of a package substrate 500 is shown, in accordance with an additional embodiment. In an embodiment, the package substrate 500 comprises a core 501. The core 501 may be a glass core 501 in some embodiments. Additionally, one or more buildup layers (not shown) may be provided between the core 501 and the pads 510 and traces 512. In the illustrated embodiment, only the top side of the core 501 is shown. Though, it is to be appreciated that pads 510, traces 512, and the like may also be formed below the core 501.

In an embodiment, pads 510 and traces 512 may be provided over the core 501. In a particular embodiment, the pads 510 may be surrounded by a shell 527. The shell 527 may be part of a surface finish layer formed over the pads 510. For example, the surface finish layer may include shell 527, first layer 522, and second layer 523. In a particular embodiment, the shell 527 may comprise nickel, the first layer 522 may comprise palladium, and the second layer 523 may comprise gold. Though, other materials or alloys may be used as part of the surface finish system.

In an embodiment, the shell 527 may be provided around sidewalls and the top surface of the pads 510. The thickness of the shell may be approximately 10 μm or less, approximately 5p m or less, or approximately 1 μm or less. As shown on the left pad 510, the attached trace portion 512 does not include the shell 527. That is, the shells 527 may be selectively formed over the pads 510.

In an embodiment, an adhesion promoting layer 516 may be provided between the solder resist layer 530 and the core 501. The adhesion promoting layer 516 may also extend up sidewalls of the shell 527 and over a portion of the top surfaces of the surface finish layer 523. The solder resist openings 532 may expose the top surface of the surface finish layer 523.

Referring now to FIGS. 6A-6F, a series of cross-sectional illustrations depicting a process for forming a package substrate 600 is shown, in accordance with an embodiment. In an embodiment, the package substrate 600 may be similar to the package substrate 500 described with respect to FIG. 5. Though, alterations to the process flow may be used to form slightly different package substrates 600.

Figure 6A:
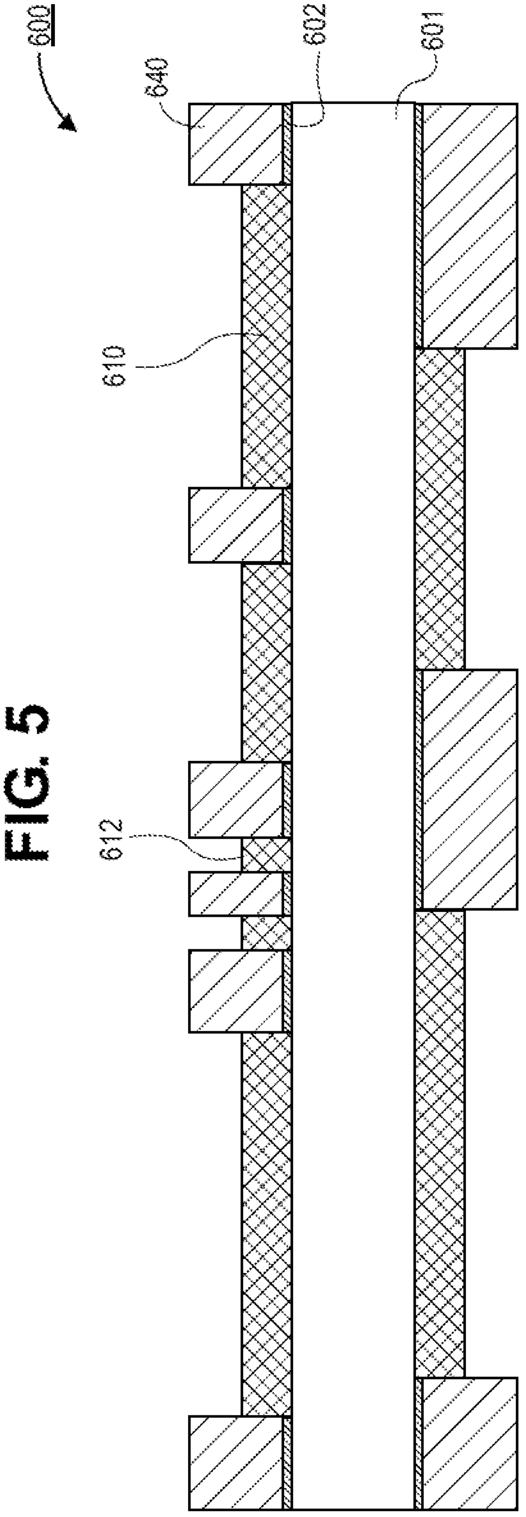
FIGS. 6A-6F are cross-sectional illustrations depicting a process for forming a package substrate with surface finishes that are plated with an electrolytic plating process, in accordance with an additional embodiment.

Referring now to FIG. 6A, a cross-sectional illustration of a package substrate 600 at a stage of manufacture is shown, in accordance with an embodiment. In an embodiment, the package substrate 600 comprises a core 601. The core 601 may be a glass core in some embodiments. In an embodiment, the core 601 may include one or more buildup layers (not shown) between the pads 610 and the core 601. In other embodiments, the pads 610 may be formed directly on the core 601. The core 601 may include TGVs (not shown) or other conductive features.

In an embodiment, a seed layer 602 is formed over the core 601. The seed layer 602 may be a continuous conductive layer across the core 601. The seed layer 602 may comprise copper and/or titanium in some embodiments. While not shown under the pads 610 or traces 612, it is to be appreciated that the seed layer 602 may also be provided under the pads 610 and traces 612. A seed layer 602 may also be provided below the core 601 in order to form pads 610 and traces 612 on the opposite side of the core 601 as well.

In an embodiment, a first resist layer 640 is provided over and under the core 601. The first resist layer 640 may be a DFR or the like. In an embodiment, the first resist layer 640 is patterned in order to form openings. The pads 610 and traces 612 may then be selectively plated in the openings (e.g., with an electrolytic plating process). The first resist layer 640 prevents plating in regions where the pads 610 and/or traces 612 are not desired.

Figure 6B:
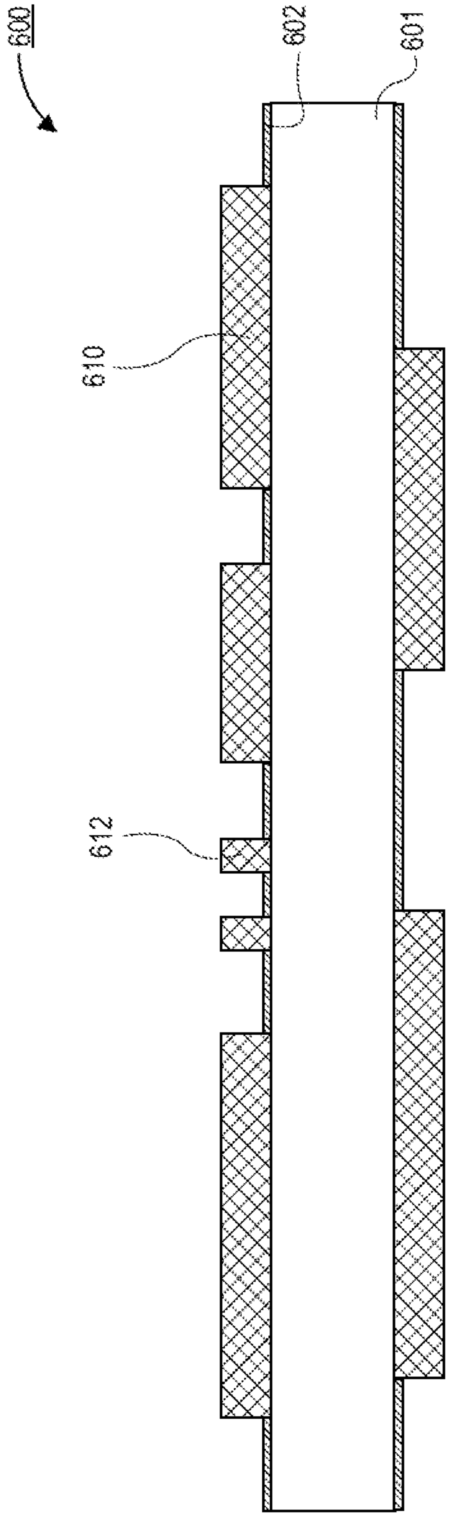

Referring now to FIG. 6B, a cross-sectional illustration of the package substrate 600 after the first resist layer 640 is removed is shown, in accordance with an embodiment. The first resist layer 640 may be removed with a resist stripping or etching process. The removal of the first resist layer 640 results in the exposure of the seed layer 602.

Figure 6C:
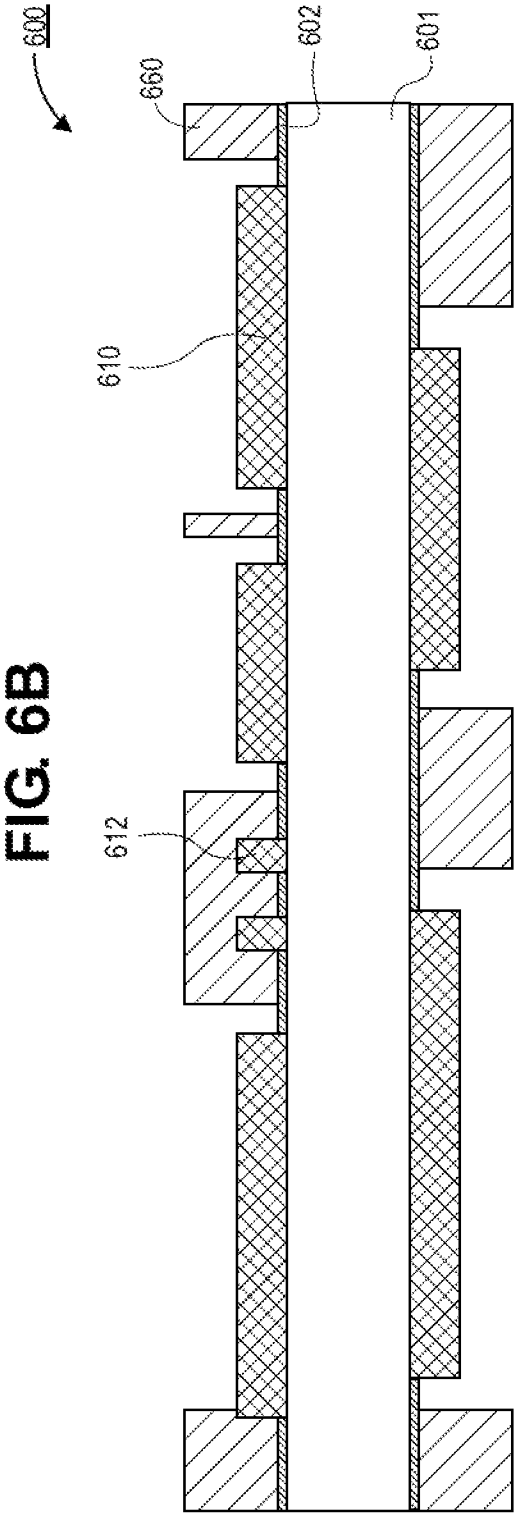

Referring now to FIG. 6C, a cross-sectional illustration of the package substrate 600 after a second resist layer 660 is deposited and patterned is shown, in accordance with an embodiment. In an embodiment, the second resist layer 660 may cover the traces 612 and leave the pads 610 exposed. The openings in the second resist layer 660 may be wider than the pads 610. The second resist layer 660 may be a DFR that is exposed and patterned with typical processes.

Figure 6D:
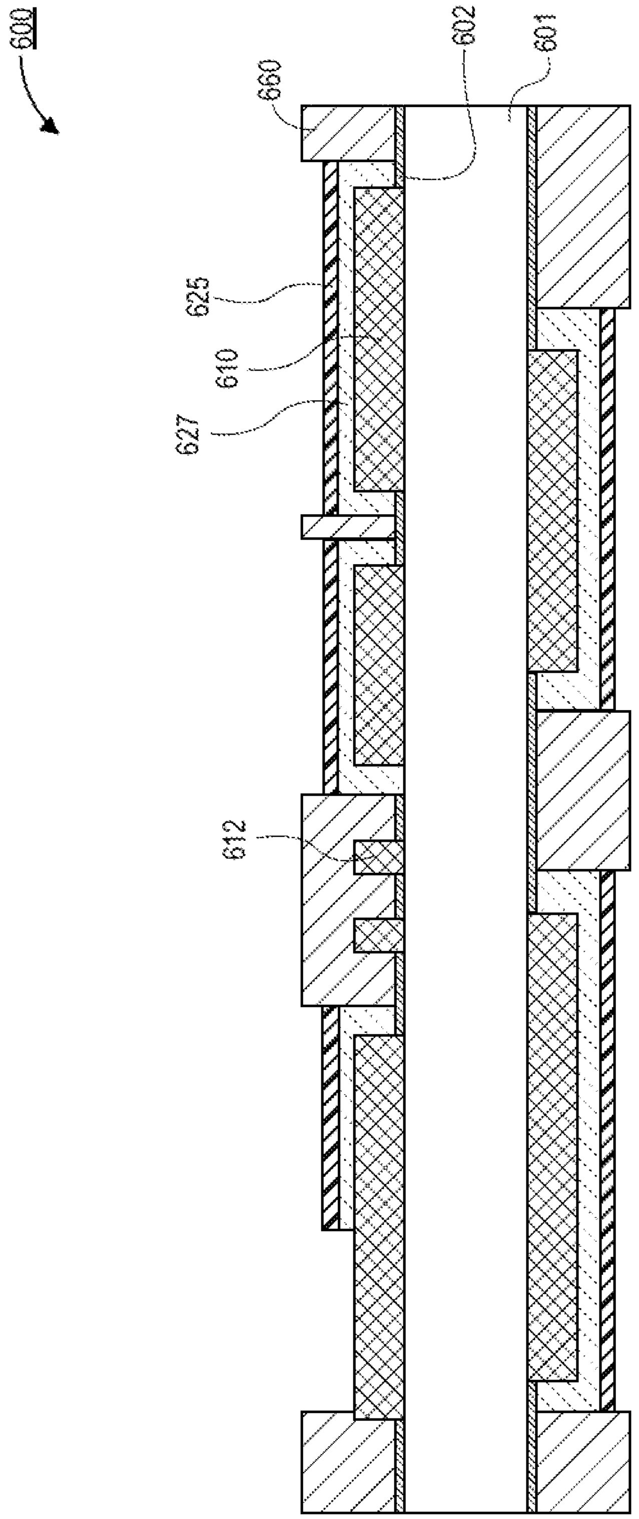

Referring now to FIG. 6D, a cross-sectional illustration of the package substrate 600 after a shell 627 and a surface finish 625 is formed over each of the pads 610 is shown, in accordance with an embodiment. Since the seed layer 602 remains in the structure, the shell 627 and the surface finish 625 may be plated with an electrolytic plating process. In an embodiment, the shells 627 may cover sidewalls and top (or bottom) surfaces of the pads 610. The shells 627 may include any material suitable for use in a surface finish system. In a particular embodiment, the shells 627 may comprise nickel.

In an embodiment, the surface finish 625 may be provided over top (or bottom) surfaces of the shells 627. The surface finish 625 may include two or more separate layers in some embodiments. For example, the surface finish 625 may comprise a layer of palladium and a layer of gold. Though other materials, alloys, or the like may also be used in the surface finish 625. In an embodiment, the surface finish 625 has a width that is wider than a width of the underlying pad 610. That is, the surface finish 625 may have a width that is equal to the width of the opening through the second resist layer 660.

Figure 6E:
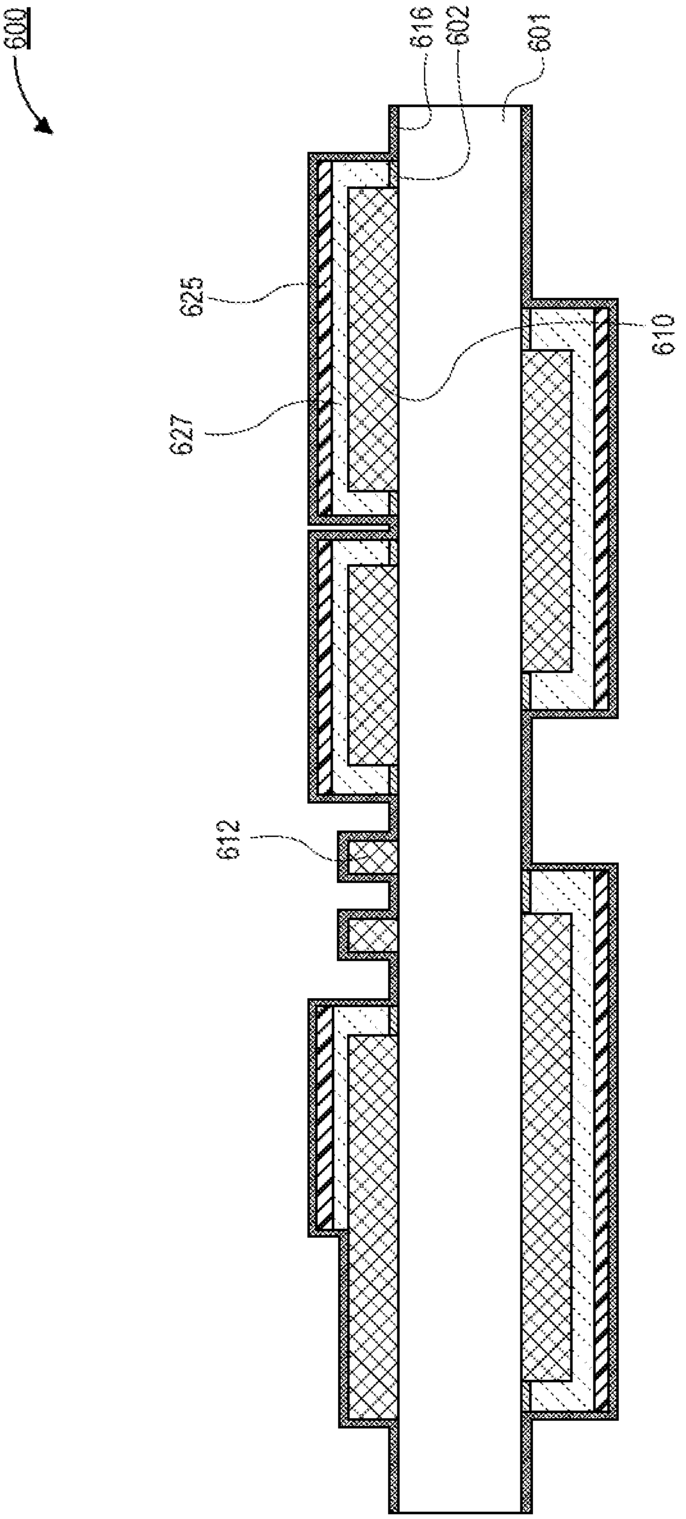

Referring now to FIG. 6E, a cross-sectional illustration of the package substrate 600 after the second resist layer 660 is removed is shown, in accordance with an embodiment. The second resist layer 660 may be removed with a stripping or etching process. In an embodiment, after removal of the second resist layer 660, a seed etching process may be used to electrically isolate the pads 610 and traces 612 from each other. The seed etching process may be a flash etching process or the like.

After the seed layer 602 is etched, an adhesion promoting layer 616 may be applied. The adhesion promoting layer 616 may cover the traces 612, the sidewalls of the shells 627, and the top (or bottom) surfaces of the surface finish 625. The adhesion promoting layer 616 may also cover a surface of the core 601 and/or any intervening buildup layers (not shown). In an embodiment, the adhesion promoting layer 616 may be any suitable material that improves the adhesion of the structure to a solder resist layer deposited in a subsequent processing operation. For example, the adhesion promoting layer 616 may comprise silicon and nitrogen (e.g., silicon nitride).

Figure 6F:
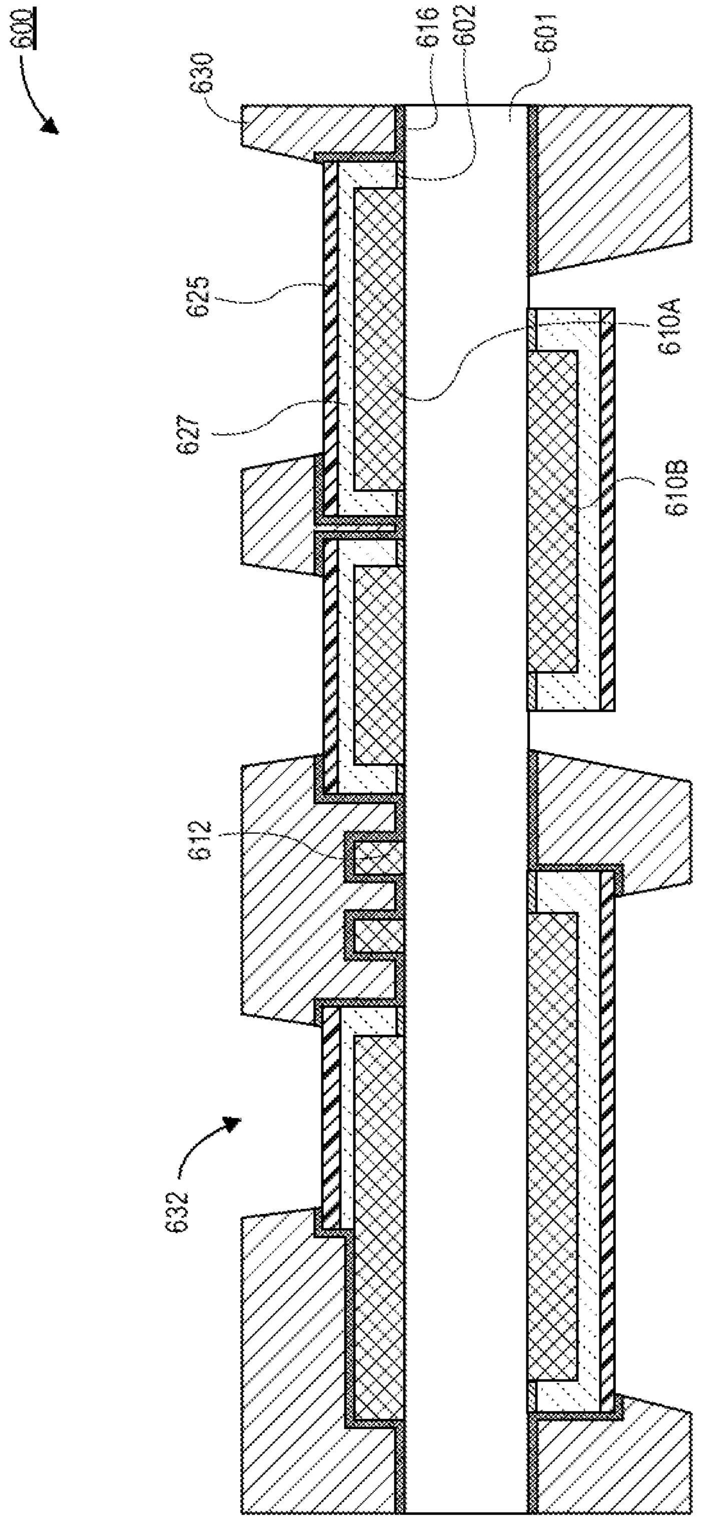

Referring now to FIG. 6F, a cross-sectional illustration of the package substrate 600 after solder resist layers 630 are applied over and under the core 601 is shown, in accordance with an embodiment. In an embodiment, the solder resist layers 630 may be applied with a lamination process or the like. In an embodiment, solder resist openings 632 are provided through the solder resist layers 630 to expose pads 610. In some embodiments, the solder resist openings 632 are narrower than the shell 627 and provide solder defined pads 610A. In other embodiments, the solder resist openings 632 are wider than the shell 627 and provide metal defined pads 610B.

In an embodiment, the adhesion promoting layer 616 exposed by the formation of the solder resist openings 632 is removed. For example, a descumming or dry etching process may be used to remove portions of the adhesion promoting layer 616. In embodiments with solder defined pads 610A, portions of the adhesion promoting layer 616 may remain along the top (or bottom) edges of the pads 610A outside of the solder resist openings 632.

Figure 7:
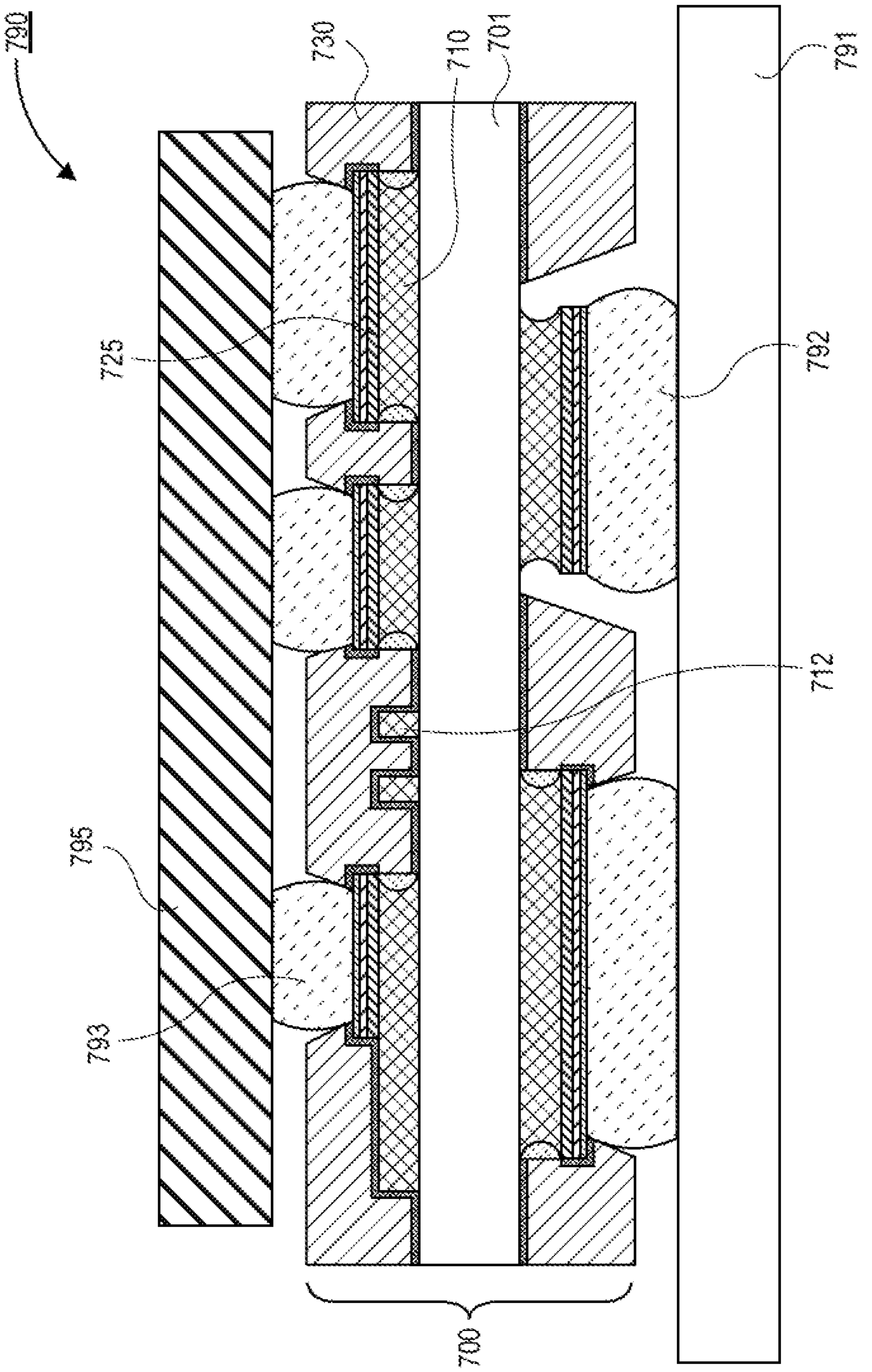
FIG. 7 is a cross-sectional illustration of an electronic system that includes a package substrate with a glass core and pads that have a surface finish applied with an electrolytic plating process, in accordance with an embodiment.

Referring now to FIG. 7, a cross-sectional illustration of an electronic system 790 is shown, in accordance with an embodiment. In an embodiment, the electronic system 790 may comprise a package substrate 700 that is coupled to a board 791 (e.g., a printed circuit board (PCB)) by interconnects 792. The interconnects 792 may be solder interconnects 792 or any other suitable interconnect architecture.

In an embodiment, the package substrate 700 may be substantially similar to the package substrate 100 described in greater detail above. However, it is to be appreciated that the package substrate 700 may be similar to any of the package substrates described in greater detail herein. In an embodiment, the package substrate 700 comprises a core 701. Pads 710 and traces 712 may be provided over the core 701. A surface finish layer 725 may be provided over the pads 710. While three distinct surface finish layers 725 are shown in FIG. 7, it is to be appreciated that any number of surface finish layers 725 may be used.

In an embodiment, the package substrate 700 may be coupled to a die 795 by interconnects 793. In an embodiment, interconnects 793 are solder bumps. Though, any suitable interconnect architecture may be used. Additionally, while a single die 795 is shown, it is to be appreciated that multiple dies 795 may also be included in the electronic system 790.

Figure 8:
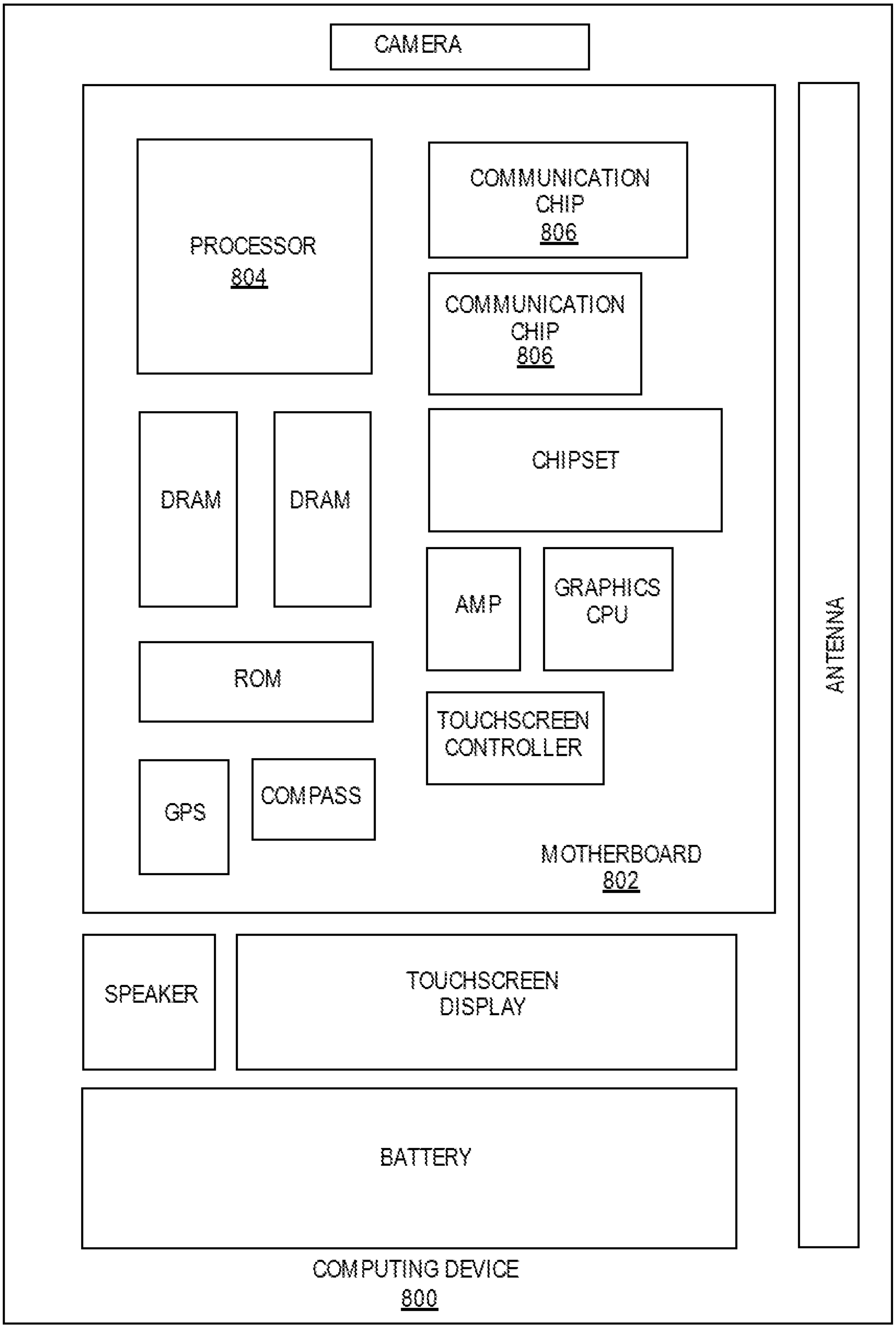
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be part of an electronic system that includes a package substrate with a glass core and surface finishes over pads that are formed with an electrolytic plating process, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be part of an electronic system that includes a package substrate with a glass core and surface finishes over pads that are formed with an electrolytic plating process, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a package substrate, comprising: a core; a pad over the core, wherein the pad has a first width; a surface finish over the pad, wherein the surface finish has a second width that is substantially equal to the first width; and a solder resist over the pad, wherein the solder resist comprises an opening that exposes a portion of the surface finish, wherein the opening has a third width that is smaller than the second width.

Example 2: the package substrate of Example 1, wherein the pad comprises undercuts along edges of the pad.

Example 3: the package substrate of Example 2, wherein the undercuts are filled with the solder resist.

Example 4: the package substrate of Example 3, wherein a degree of cross-linking of the solder resist in the undercuts is different than a degree of cross-linking of the remainder of the solder resist.

Example 5: the package substrate of Examples 1-4, further comprising: an adhesion promoting layer over portions of the surface finish.

Example 6: the package substrate of Example 5, wherein the adhesion promoting layer is absent from the surface finish under the opening in the solder resist.

Example 7: the package substrate of Example 5 or Example 6, wherein the adhesion promoting layer comprises silicon and nitrogen.

Example 8: the package substrate of Examples 1-7, wherein the pad is a solder resist defined pad.

Example 9: the package substrate of Examples 1-8, wherein the pad is a metal defined pad.

Example 10: the package substrate of Examples 1-9, wherein the core comprises a borosilicate glass or a fused silica glass.

Example 11: the package substrate of Examples 1-10, wherein the surface finish comprises nickel, palladium, and gold.

Example 12: a method of forming a package substrate, comprising: forming a pad over a core with the use of a first opening in a first resist layer; disposing a second resist layer over the first resist layer, wherein the second resist layer comprises a second opening over the first opening; disposing a surface finish over the pad; removing the first resist layer and the second resist layer; removing a seed layer used to plate the pad; disposing a solder resist over the pad; and forming a third opening in the solder resist to expose a portion of the surface finish.

Example 13: the method of Example 12, further comprising: forming an adhesion promoting layer over the surface finish, and wherein the adhesion promoting layer is removed from the third opening.

Example 14: the method of Example 13, wherein the adhesion promoting layer comprises silicon and nitrogen.

Example 15: the method of Examples 12-14, wherein the surface finish is plated with an electrolytic plating process.

Example 16: the method of Examples 12-15, wherein the surface finish comprises nickel, palladium, and gold.

Example 17: the method of Examples 12-16, wherein removing the seed layer results in undercuts formed along the edges of the pad.

Example 18: the method of Examples 12-17, wherein the core comprises glass.

Example 19: an electronic system, comprising: a board; a package substrate coupled to the board, wherein the package substrate comprises: a core; a pad over the core; and a surface finish over the pad, wherein the surface finish is deposited with an electrolytic process; and a die coupled to the package substrate.

Example 20: the electronic system of Example 19, wherein the pad comprises undercuts along edges of the pad.

What is claimed is:

1. A package substrate, comprising:

a core;

a pad over the core, wherein the pad has a first width, and wherein the pad comprises undercuts along edges of the pad;

a surface finish over the pad, wherein the surface finish has a second width that is substantially equal to the first width; and a solder resist over the pad, wherein the solder resist comprises an opening that exposes a portion of the surface finish, wherein the opening has a third width that is smaller than the second width.

2. The package substrate of claim 1, wherein the undercuts are filled with the solder resist.

3. The package substrate of claim 2, wherein a degree of cross-linking of the solder resist in the undercuts is different than a degree of cross-linking of the remainder of the solder resist.

4. The package substrate of claim 1, further comprising:

an adhesion promoting layer over portions of the surface finish.

5. The package substrate of claim 4, wherein the adhesion promoting layer is absent from the surface finish under the opening in the solder resist.

6. The package substrate of claim 4, wherein the adhesion promoting layer comprises silicon and nitrogen.

7. The package substrate of claim 1, wherein the pad is a solder resist defined pad.

8. The package substrate of claim 1, wherein the pad is a metal defined pad.

9. The package substrate of claim 1, wherein the core comprises a borosilicate glass or a fused silica glass.

10. The package substrate of claim 1, wherein the surface finish comprises nickel, palladium, and gold.

11. A method of forming a package substrate, comprising:

forming a pad over a core with the use of a first opening in a first resist layer;

disposing a second resist layer over the first resist layer, wherein the second resist layer comprises a second opening over the first opening;

disposing a surface finish over the pad;

removing the first resist layer and the second resist layer;

removing a seed layer used to plate the pad, the removing forming undercuts along edges of the pad;

disposing a solder resist over the pad; and forming a third opening in the solder resist to expose a portion of the surface finish.

12. The method of claim 11, further comprising:

forming an adhesion promoting layer over the surface finish, and wherein the adhesion promoting layer is removed from the third opening.

13. The method of claim 12, wherein the adhesion promoting layer comprises silicon and nitrogen.

14. The method of claim 11, wherein the surface finish is plated with an electrolytic plating process.

15. The method of claim 11, wherein the surface finish comprises nickel, palladium, and gold.

16. The method of claim 11, wherein removing the seed layer results in undercuts formed along the edges of the pad.

17. The method of claim 11, wherein the core comprises glass.

18. An electronic system, comprising:

a board;

a package substrate coupled to the board, wherein the package substrate comprises:

a core;

a pad over the core, wherein the pad comprises undercuts along edges of the pad; and a surface finish over the pad, wherein the surface finish is deposited with an electrolytic process; and a die coupled to the package substrate.

19. The electronic system of claim 18, wherein the undercuts are filled with a solder resist.

* * * * *